US006507796B2

(12) United States Patent
Alexander

(10) Patent No.: US 6,507,796 B2
(45) Date of Patent: Jan. 14, 2003

(54) SYSTEM AND METHOD FOR GENERATING A DATABASE OF PULSE CHARACTERISTICS FOR EACH PULSE OF AN ACQUIRED SIGNAL IN A SIGNAL MEASUREMENT SYSTEM

(75) Inventor: Jay A. Alexander, Monument, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/139,309

(22) Filed: May 6, 2002

(65) Prior Publication Data

US 2002/0128786 A1 Sep. 12, 2002

Related U.S. Application Data

(62) Division of application No. 09/686,663, filed on Oct. 11, 2000.

(51) Int. Cl.7 .............................................. G06F 19/00
(52) U.S. Cl. ........................................ 702/70; 707/104
(58) Field of Search ............................ 702/70, 71, 73; 324/76.11, 76.12; 707/100, 102, 104

(56) References Cited

U.S. PATENT DOCUMENTS

| | | | | |
|---|---|---|---|---|
| 5,343,405 A | * | 8/1994 | Kucera et al. ................ 702/73 |
| 5,532,944 A | * | 7/1996 | Battista ........................... 708/3 |
| 5,852,789 A | * | 12/1998 | Trsar et al. .................. 701/102 |
| 5,935,187 A | * | 8/1999 | Trsar et al. .................. 701/102 |
| 6,137,283 A | * | 10/2000 | Williams et al. ......... 324/76.12 |
| 6,263,290 B1 | * | 7/2001 | Williams et al. .............. 702/71 |
| 6,301,547 B2 | * | 10/2001 | Felps ............................ 702/67 |
| 6,320,577 B1 | * | 11/2001 | Alexander ............... 345/440.1 |

* cited by examiner

Primary Examiner—Patrick Assouad

(57) ABSTRACT

A pulse management system for use by an operator that automatically performs measurements on a subset of pulses of an acquired signal stored in an acquisition memory, and generates an accessible data structure that stores characteristics of the chosen subset of acquired signal pulses, including pulse measurement results. The system searches the data structure for pulses of the acquired signal that satisfy operator-provided search criteria. In addition, the operator can sort the selected pulses in any desired manner by specifying a desired sort criteria. The system displays selected pulses along with the associated measurement results, and enables the operator to advance through the selected pulses in any mannerism to display different pulses together or separately along with the associated pulse measurement results. A method for analyzing pulses of an acquired signal is also disclosed. The method includes the step of generating a pulse data array having stored therein pulse characteristics of a previously acquired signal, followed by the step of analyzing the contents of the pulse data array in response to operator specifications.

14 Claims, 17 Drawing Sheets

FIG. 4

206 PULSE DATA ARRAY

| ACQ. # 402 | MEASUREMENT STATISTICS 324 | PULSE # 404 (PULSE # INDEX) | PULSE TYPE 406 | CENTER TIME 408 | PULSE MEASUREMENTS 410 |
|---|---|---|---|---|---|
| 1 | RISE TIME<br>MEAN =<br>MODE =<br>MEDIAN =<br>⋮<br><br>FALL TIME<br>MEAN =<br>MODE =<br>MEDIAN =<br>⋮ | 1 | P | 1 μs | RISE TIME = 20.5 ns<br>FALL TIME = 16.1 ns<br>WIDTH = 102.3 ns<br>V p-p = 2.62 v<br>OVERSHOOT = 7.65 %<br>⋮ |
|  |  | 2 | N | 1.5 μs | ⋮ |
|  |  | 3 | P | 2.1 μs | ⋮ |
|  | ⋮ | ⋮ | ⋮ | ⋮ | ⋮ |
|  |  | 1075 | ⋮ | ⋮ | ⋮ |
| 2 | ⋮ | ⋮ | ⋮ | ⋮ | ⋮ |
| 3 | ⋮ | ⋮ | ⋮ | ⋮ | ⋮ |
| ⋮ | ⋮ | ⋮ | ⋮ | ⋮ | ⋮ |

800
PULSE MEASUREMENT SELECTION
DIALOG BOX

950
PULSE SORT CRITERIA DIALOG BOX

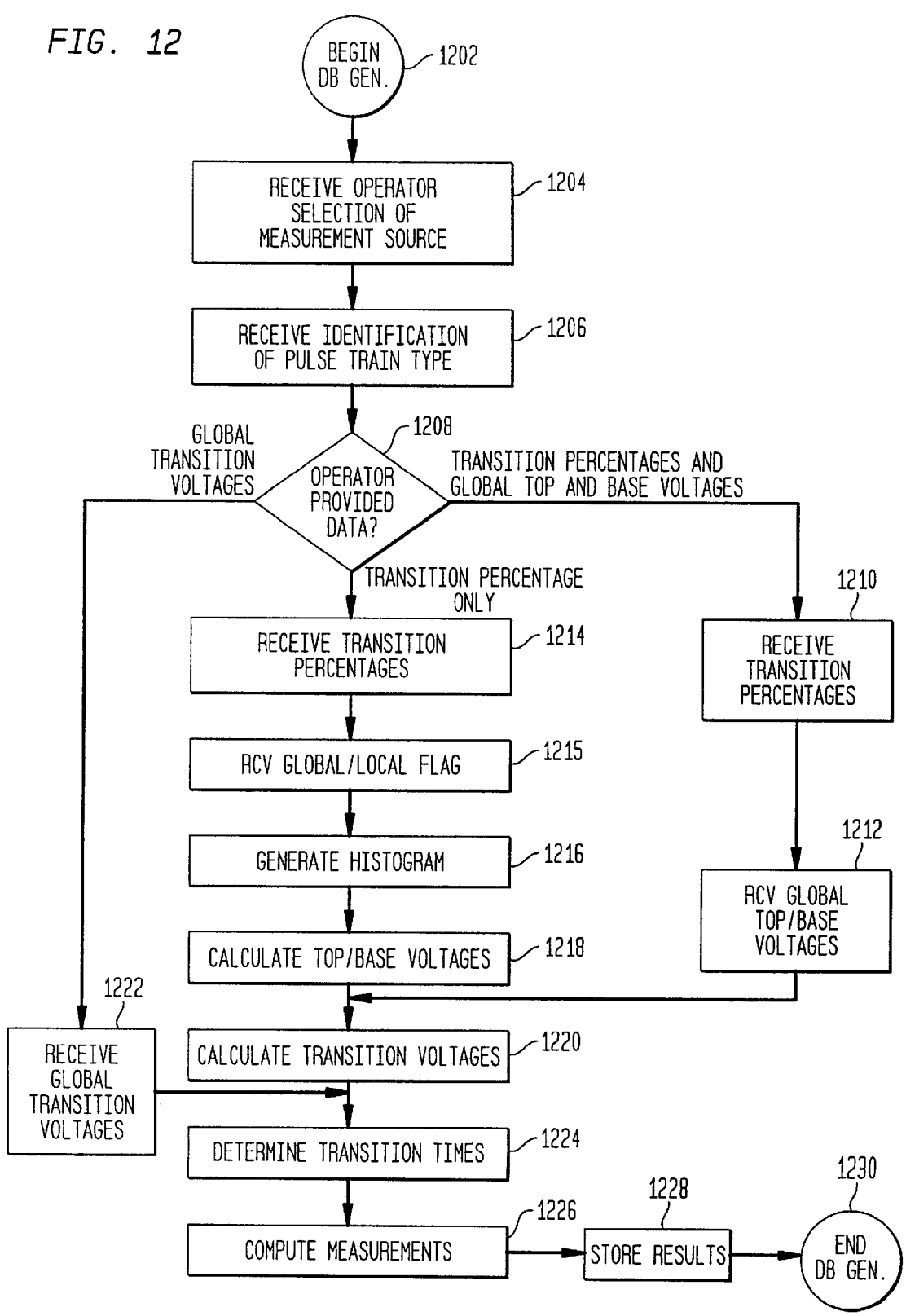

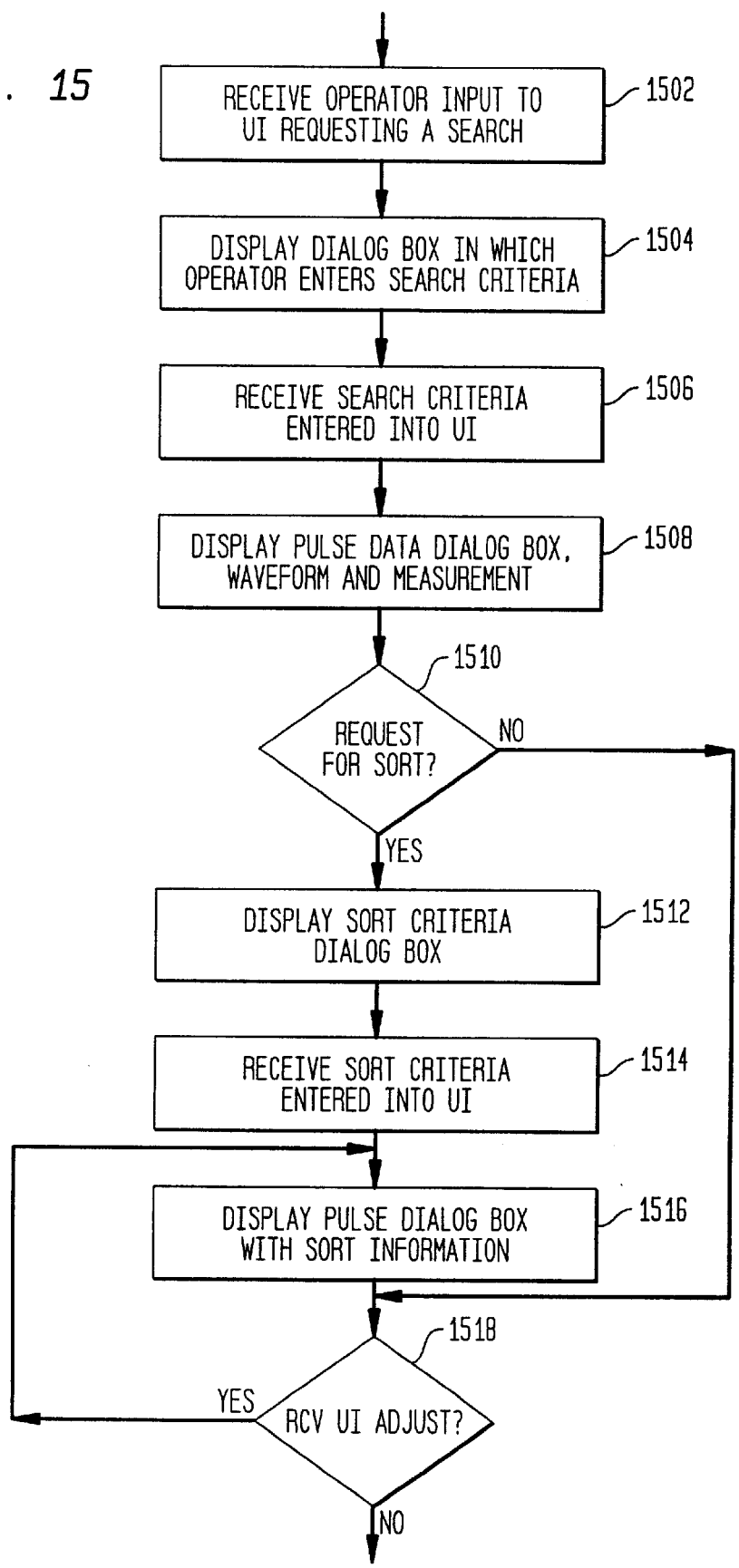

SYSTEM AND METHOD FOR GENERATING A DATABASE OF PULSE CHARACTERISTICS FOR EACH PULSE OF AN ACQUIRED SIGNAL IN A SIGNAL MEASUREMENT SYSTEM

RELATED APPLICATIONS

This is a Divisional of copending application Ser. No. 09/686,663, filed on Oct. 11, 2000, the entire disclosure of which is incorporated herein by reference.

The present application is related to the following commonly owned applications which are hereby incorporated by reference herein in this application U.S. Application entitled "System and Method For Enabling an Operator to Analyze a Database of Acquired Signal Pulse Characteristics" naming as inventor Jay A. Alexander, and filed concurrently herewith under Ser. No. 09/686,776; and U.S. Application entitled "Voice-Responsive Command and Control System and Methodology For Use In A Signal Measurement System" naming as inventors Jay A. Alexander and Michael Karin, filed on Aug. 30, 1999 under Ser. No. 09/386,531.

BACKGROUND OF THE INVENTION

1. Field of the Invention

The present invention relates generally to signal measurement systems and, more particularly, to managing a large number of acquired pulses in a signal measurement system.

2. Related Art

Conventional signal measurement systems such as digital oscilloscopes sample, record and display time-varying analog signals. Samples of an input signal are taken and quantified, and the resultant digital representations are stored in an acquisition memory under the control of a sampling clock. The acquired signal data may be subsequently retrieved as locations in memory are read out to provide digital data that can be further processed for output to a display, where an operator may view a waveform representation of the time-varying signal. The sampling clock can be operated at one of several selectable rates depending on the frequency content of the input signal. The portion of the input signal that is acquired; that is, sampled and stored, is determined by appropriate triggering circuitry to enable the operator to capture and display the desired portion of the waveform.

Traditional digital oscilloscopes are typically implemented with acquisition memories sufficient to store perhaps as much as 16,000 to 50,000 signal samples per channel. Typically, an 8-bit analog-to-digital (AID) converter is implemented, resulting in each sample consuming 1 byte of memory, although other conventional systems implement a 16-bit A/D converter. More recent oscilloscopes are often implemented with considerably larger acquisition memories, perhaps on the order of 2–32 Mbytes. Having such deep acquisition memories enables modem digital oscilloscopes to capture long time spans of a signal in a single acquisition. When the acquisition signal consists of al series of pulses, as in common in digital computer and communication systems, this means that many pulses of information are stored in the oscilloscope's memory. For example, digitizing a 1.44 Mb/s T1 communication signal at 100 Msamples/second in a 2 Mbyte deep system can result in as many as 30,000 pulses of information being stored. Managing the display and measurement of such a large number of pulses presents a considerable challenge to the oscilloscope operator. In many cases, the operator's goal is to identify one or more anomalous pulses from the more numerous normal pulses. Typically, the number of anomaly is unknown, so defining a trigger condition for the anomaly is not possible. This means the operator must reply on visual inspection and manually-initiated measurements performed on one pulse at a time. Due to a limited size and resolution of the oscilloscope's display, only a small number of pulses, may be accessed simultaneously at a horizontal scaling sufficient for accurate characterization. Analyzing all the pulses of a given acquisition this way requires the operator to manually advance through the data a few pulses at a time, a prohibitively time-consuming process. As a result, operators of conventional systems are limited to accessing only a small subset of the pulses, generally, in an ad hoc or unstructured maimer. This reduces the likelihood that the operator of a conventional deep memory oscilloscope will successfully identify anomalous pulses efficiently.

Whether or mot anomalous pulses are present in the acquired signal, the operator may wish to determine the statistics of certain measurements across a large number of pulses in the acquisition for the purpose of margins analysis. For example, the duty cycle of a clock waveform may need to be analyzed to insure that the minimum and maximum bounds are not exceeded. Some conventional systems include facilities for determining measurement statistics, however, in such implementations, the statistics are accumulated from measurements performed over multiple acquisitions and/or the results are computed such that a given measurement value is not readily traceable to the pulse it is associated with. Accumulating statistics over multiple acquisitions is disadvantageous because the acquisitions may relate to different operating conditions in the circuit or system being analyzed. Additionally, depending on how many pulses are measured from each acquisition, the time spacing between measured pulses may vary significantly, making stat istical understanding less straightforward. When statistics are computed without traceability to individual pulses, the operator is unable to view the particular pulse associated with the given measurement result. Without a view of the pulse, the operator is at a loss to determine when caused the measurement result. In sum, in currently availabe signal measurement systems, it is difficult for an operator to characterize or troubleshoot a system or circuit through analysis of the large number of pulses that may be captured in a single acquisition.

What is needed, therefore, is a system and method that enables the operator to effectively manage a large number of acquired pulses to achieve a desired analytical or evaluative objective.

SUMMARY OF THE INVENTION

The present invention is directed to a pulse management system that addresses the above or other drawbacks of conventional systems. The pulse management system is configured to perform a plurality of pulse measurements on each of a plurality of pulses of an acquired signal. The pulse management system is further configured to store results of the pulse measurements in an accessible data structure. Importantly, the pulse management system performs these operations automatically and with substantially no operator involvement.

The consolidation of such pulse measurements has not heretofore been provided by conventional systems. Traditionally, individual pulse measurements have been performed in response to specific actions taken by an operator for a specified pulse displayed on a waveform display. The results of such a single pulse measurement may or may not have been stored beyond that necessary to display the measurement results to the operator. Due to the many thousands of operator actions that would be necessary to invoke a number of traditional pulse measurements on the perhaps thousands of acquired pulses, there has been no attempt heretofore to provide any structure for storing or organizing such measurement data. The pulse management system performs such pulse measurements with minimal operator participation; that is, individual signal pulses need not be displayed and the operator is relieved of the burdensome task of individually applying specific pulse measurements to individual pulses. The present invention also provides a searchable data structure of pulse measurement results for any and if desired, all, acquired pulses, facilitating the implementation of simple and intuitive techniques for searching, sorting and otherwise manipulating the pulse measurements by the operator to gain insights into specific pulses or pulses exhibiting particular behaviors and identify trends or gradual variations of signal behavior and other subtleties that would otherwise be lost in conventional systems. In other Words, an extensive, detailed analysis of system and circuit behavior can now be performed by an operator with little or no involvement in the generation of the necessary pulse measurement data to perform such an analysis.

A number of aspects of the invention are summarized below, along with different embodiments that may be implemented for each of the summarized aspects. It should be understood that the embodiments are not necessarily inclusive or exclusive of each other and may be combined in any manner that is non-conflicting and otherwise possible. It should also be understood that these summarized aspects of the invention are exemplary only and are considered to be non-limiting.

In one aspect of the invention a pulse management system is disclosed. The pulse management system is configured to perform a plurality of pulse measurements on each of a plurality of pulses of an acquired signal. The pulse management system is further configured to store results of the pulse measurements in an accessible data structure. Importantly, the pulse management system performs these operations with substantially no operator involvement. In one application, the pulse management system is implemented in a signal measurement system such as a digital oscilloscope. In such an application, the acquired signal is acquired by the digital oscilloscope and the pulse management system is implemented in the digital oscilloscope to perform the noted pulse measurements on the acquired signal pulses.

In another aspect of the invention, a pulse database generator for use in a signal measurement system such as a digital oscilloscope is disclosed. The pulse database generator processes acquisition data of an acquired signal in accordance with measurement parameters to generate pulse characteristic data for storage in a pulse data structure. The pulse characteristic data includes results of a plurality of pulse measurements applied to a plurality of acquired signal pulses. In one embodiment, the pulse database generator includes a histogrammer and a mode finder. The histogrammer samples the acquisition data to generate one or more histograms each comprising a distribution of the number of occurrences that the acquired signal attained each of a plurality of signal levels. The mode finder identifies one or more modes of this histogram representing one or more signal levels that occur most frequently in the histogram. Each of the modes represents a signal level having a logical interpretation.

In one embodiment of this aspect of the invention, the pulse database generator also includes a transition calculator that determines a transition signal level at each of one or more transition percentages. Each transition percentage is a percentage of the difference between two of the signal levels having a logical interpretation. Preferably, this embodiment also includes a data analyzer that processes the acquisition data to determine the times at which each pulse attains each of the transition signal levels, referred to herein as transition times. The pulse database generator also includes or controls a pulse measurement engine that performs the pulse measurements on each of the pulses utilizing the transition times and a pulse type indication. Preferably, the to pulse characteristic data also includes results of statistical analyses performed on the pulse measurement results.

In another embodiment of this aspect, the pulse database generator includes a transition calculator that determines the signal level at each specified transition percentage based on one or more signal levels for each logical state of the pulse in the acquired signal including at least a top signal level and base signal level. The one or more signal levels are provided by the operator.

In one application, the signal levels that have a logical interpretation include a top signal level and a base signal level. The transition calculator determines transition signal levels achieved by each pulse at the transition percentages as the signal transitions between said top and base signal levels. In one embodiment, the transitional percentages include 10%, 50% and 90% of the difference between the top said base signal levels. In an alternative embodiment, the transition percentages can be provided by the operator through a user interface.

In a further aspect of the invention, a signal measurement system is disclosed. The signal measurement system analyzes pulses of an acquired signal represented by acquisition data stored in a memory device of the signal measurement system. The signal measurement system includes a computing device having a memory and a computer-readable medium. Stored in the computer-readable medium are instructions that, when executed by the computing device, processes the acquisition data in accordance with measurement parameters to generate pulse characteristic data for storage in a pulse data structure in the memory. The pulse characteristic data includes results of a plurality of pulse measurements applied to pulses of the acquired signal.

In one embodiment, the computer-readable medium of instructions includes means for generating a histogram of the acquired signal and means for identifying modes of the histogram. In alternative embodiments, the computer-readable medium of instructions also includes Leans for determining a transition signal level at each of one or more transition percentages, each transition percentage being a percentage of a difference between two signal levels having a logical Interpretation. In a further embodiment, the computer-readable medium of instructions also include means for determining transition times at which each pulse attains each transition signal level. Finally, in certain embodiments, the computer-readable medium of instructions includes means for performing pulse measurements on each of the pulses utilizing the transition times and pulse type indication.

In a further aspect of the invention, a data structure for storage in a memory apparatus operationally coupled to a signal measurement system is disclosed. The data structure includes a plurality of signal pulse characteristics of a plurality of pulses of an acquired signal stored in an acquisition memory of the signal measurement system. The signal pulse characteristics include a pulse identifier uniquely identifying each pulse of the acquired signal, and a plurality of pulse measurement results associated with each pulse identifier. Preferably, the pulse identifier is a value indicating a relative order of occurrence of the associated pulse relative to other pulses of the acquired signal. The plurality of pulse measurement results associated with each of the pulse identifiers in the data structure include one or more of the following: rise time measurement results, fall time measurement results, pulse width measurement results, peak-to-peak voltage measurement results, minimum voltage measurement results, maximum voltage measurement results, pulse area measurement results, delta time measurement results, and overshoot measurement results, among others.

In one embodiment of this aspect of the invention, the signal pulse characteristics may also include a time of occurrence associated with each pulse identifier in the data structure. The time of occurrence indicates a time the associated pulse occurred relative to a time at which a trigger event causing acquisition of the acquired signal occurred. In other embodiments, the data structure also stores global measurement statistics for one or more of the pulse measurements. The global statistics are associated with the acquired signal in the data structure. Preferably, the pulse characteristics also include a pulse type that is associated with each of the pulse identifiers. The pulse type may indicate, for example, whether the corresponding signal pulse is a positive or negative pulse.

In certain applications, the acquired signal is one of a plurality of acquired signals, the acquisition data for each of which is stored in an acquisition memory. In such applications, alternative embodiments of the data structure may include the pulse characteristics and global measurement statistics for more than one acquired signal. Each of the pulse characteristics and global measurement statistics are preferably associated with the unique acquisition identifier that resulted in the capture of the acquired signal.

In a further aspect of the invention, the pulse characteristics and pulse identifiers are stored in the pulse data structure automatically and with no operator involvement. Alternatively, the data structure is populated in accordance with measurement parameters. In other embodiments, the measurement parameters are provided at least in part by the operator through a user interface operatively coupled to the signal measurement system. In still other embodiments, the data structure is generated and populated with the pulse characteristics in response to the acquisition memory storing the acquired signal.

In another aspect of the invention, a method for generating a pulse data structure for storage in a memory apparatus operationally coupled to a signal measurement system is disclosed. The data structure includes a plurality of signal pulse characteristics of a subset of pulses of an acquired signal stored as acquisition data in an acquisition memory of the signal measurement system. The method includes the steps of: 1) performing a plurality of pulse measurements on each of the subset of acquired signal pulses. This step utilizes the transition times, acquisition signal data and a pulse train type to perform the measurements. In addition, the method includes the step of storing results of the pulse measurements in the pulse data structure such that the measurement results are associated with a unique identifier of each measured pulse of the acquired signal.

In one embodiment, the method includes the steps of: 3) receiving, before step 1), an indication of the type of pulse train embodied in the acquisition signal; 4) determining, before step 1), transition signal levels at one or more transition percentages between a top signal level and a base signal level; and 5) determining, before step 1), transition times, each pulse of the acquired signal attains each of the transition signal levels.

In another embodiment, step 4) includes the steps of: a) receiving one or more transition percentages; b) generating a histogram of the acquisition data; c) determining top, base and other voltage levels based on modes of the histogram and the pulse train type; and d) calculating transition voltages at each of the transition percentages relative to the top and base voltages for the pulse train type. Alternatively, step 4) can include the steps of: a) receiving one or more transition percentages; b) receiving top and base voltages; Land c) calculating transition voltages at each of the transition percentages relative to the top and base voltages for the pulse train type. In a still further embodiment, step 4) includes the step of: a) receiving the transition signal levels at the one or more transition percentages between the top signal level and the base signal level.

In another aspect of the invention, a method for generating a pulse data structure for storage in a memory apparatus operationally coupled to a signal measurement system is disclosed. The data structure includes a plurality of signal pulse characteristics of all or a subset of pulses of an acquired signal stored as acquisition data in an acquisition memory of the signal measurement system. The method includes the steps of: 1) performing a plurality of pulse measurements on each of a plurality of pulses of the acquired signal. This step utilizes the transition times, acquisition signal data and a pulse train type to perform the measurements. In addition, the method includes the step of storing results of the pulse measurements in the pulse data structure such that the measurement results are associated with a unique identifier of each measured pulse of the acquired signal.

In one embodiment, the method includes the steps of: 3) receiving, before step 1), an indication of the type of pulse train embodied in the acquisition signal; 4) determining, before step 1), transition signal levels at one or more transition percentages between a top and base signal level; and 5) determining, before step 1), transition times each pulse of the acquired signal attains each of the transition signal levels.

In another embodiment, step 4) includes the steps of: a) receiving one or more transition percentages; b) generating a histogram of the acquisition data; c) determining top, base and other voltage levels based on modes of the histogram and the pulse train type; and d) calculating transition voltages at each of the transition percentages relative to the top and base voltages for the pulse train type. Alternatively, step 4) can include the steps of: a) receiving one or more transition percentages; b) receiving top and base voltages; and c) calculating transition voltages at each of the transition percentages relative to the top and base voltages for the pulse train type. In a still further embodiment, step 4) includes the step of: a) receiving the transition signal levels at the one or more transition percentages between the top signal level and the base signal level.

Various embodiments of the present invention provide certain advantages and overcome certain drawbacks of the above and other conventional techniques. Not all embodiments of the present invention share the same advantages and those that do may not share them under the same or similar circumstances. Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 4 is a schematic diagram of one embodiment of the pulse data array illustrated FIG. 2 and generated by the pulse database generator of FIG. 3.

FIG. 12 is a flowchart of the processes performed by the pulse manager to generate the pulse data array illustrated in FIG. 4 in accordance with one embodiment of the present invention.

FIG. 15 is a flow chart of the processes performed in a user interface to display operator controlled fields to enter data to perform the pulse analysis operations of the present invention.

DETAILED DESCRIPTION

I. Introduction

The present invention is directed to a pulse management system and associated methodologies. The pulse management system is configured to perform a plurality of pulse measurements on each of a plurality of pulses of an acquired signal. The pulse management system is further configured to store results of the pulse measurements in an accessible data structure. Importantly, the pulse management system performs these operations automatically and with substantially no operator involvement.

The consolidation of such pulse measurements has not heretofore been provided by conventional systems. Traditionally, individual pulse measurements have been performed in response to specific actions taken by an operator for a specified pulse displayed on a waveform display. The results of such a single pulse measurement may or may not have been stored beyond that necessary to display the measurement results to the operator. Due to the many thousands of operator actions that would be necessary to invoke a number of traditional signal pulse measurements on the perhaps thousands of acquired pulses, there has been no attempt heretofore to provide any structure for storing or organizing such measurement data.

The pulse management system performs such pulse measurements with minimal operator participation; that is, individual signal pulses need not be displayed and the operator is relieved of the burdensome task of individually applying specific pulse measurements to individual pulses. The present invention also provides a searchable data structure of pulse measurement results for any and, if desired, all, acquired pulses, facilitating the implementation of simple and intuitive techniques for searching, sorting and otherwise manipulating the pulse measurements by the operator to gain insights into specific pulses or pulses exhibiting particular behaviors and identify trends or gradual variations of signal behavior and other subtleties that would otherwise be lost in conventional systems. In other words, an extensive, detailed analysis of system and circuit behavior can now be performed by an operator with little or no involvement in the generation of the necessary pulse measurement data to perform such an analysis.

The disclosed aspects of the present invention are incorporated into a pulse management system or, simply, pulse manager. It should become apparent from the following disclosure, however, that the structure and operation of the present invention may be distributed across any number of components, modules, subsystems, software programs, etc., of a hosting signal measurement system.

II. System Environment

Figure 1:
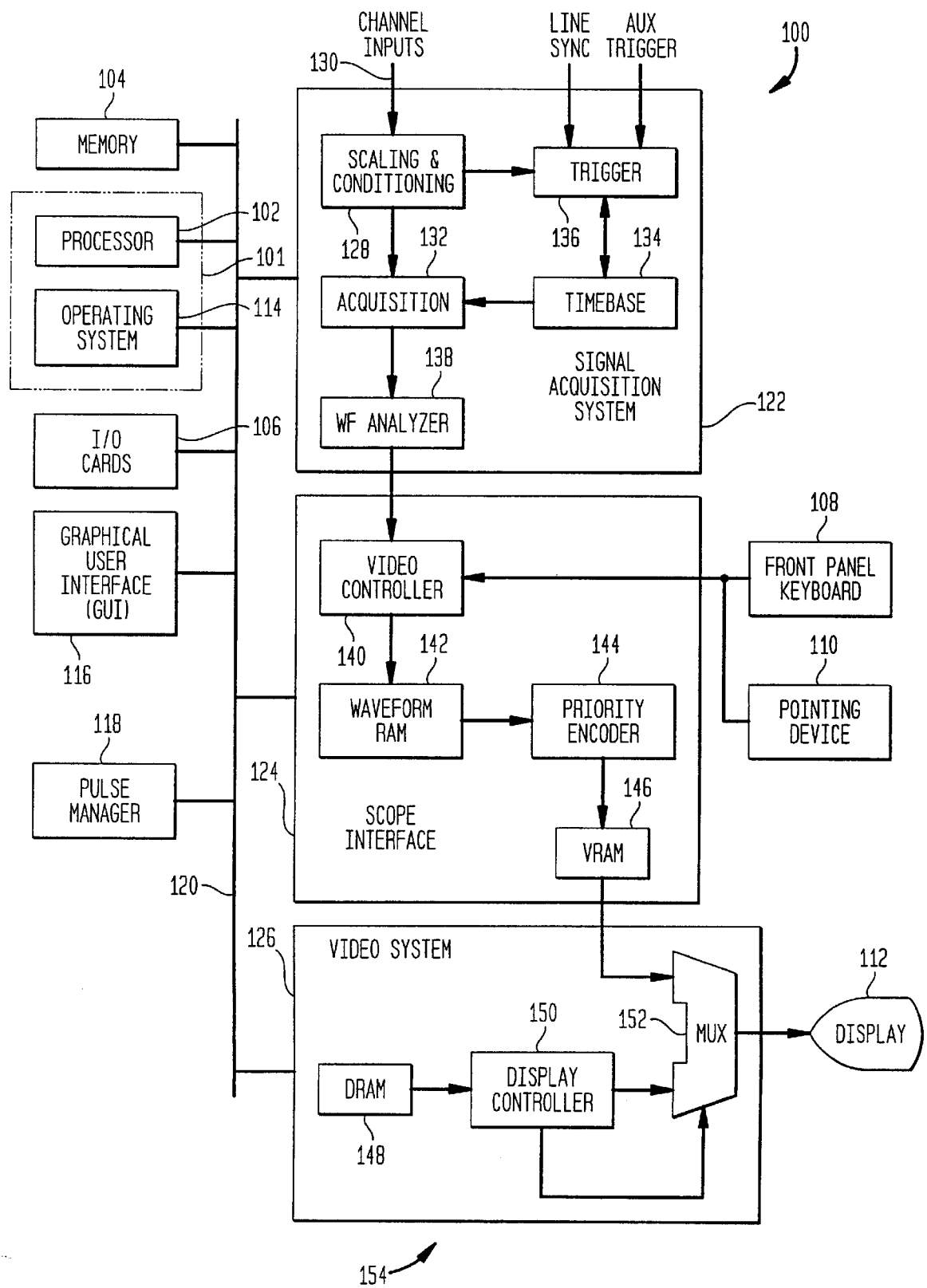
FIG. 1 is a functional block diagram of a digital oscilloscope suitable for implementing the pulse management system and methodology of the present invention.

The pulse manager may be implemented in any signal measurement system now or later developed. In one embodiment of the present invention, the pulse manager is implemented in a test and measurement instrument, such as a digital oscilloscope, logic analyzer or data recorder. FIG. 1 is a functional block diagram of an exemplary digital oscilloscope suitable for implementing aspects of the pulse manager of the present invention.

Digital oscilloscope 100 is a commonly-available digital oscilloscope designed to acquire, analyze and display a wide variety of signals generally in terms of the voltage of the signals versus time. Digital oscilloscope 100 preferably includes a general purpose computer system which is programmable using a high level computer programming language, and specially-programmed, special purpose hardware for performing signal acquisition, analysis and display functions.

Digital oscilloscope 100 includes a processor 102, a memory unit 104, input/output (I/O) interface cards 106, storage units (not shown) such as a hard disk drive and a floppy disk drive, display 112, and one or more input devices such as front keyboard panel 108 and pointing devices 110. Memory 104 is used for storage of program instructions and for storage of results of calculations performed by processor 102. In a preferred embodiment, memory 104 includes random access memory (RAM). The display is preferably a liquid crystal display and is logically or physically divided into an array of picture elements (pixels). Input/output (I/O) interface cards 106 may be modem cards, network interface cards, sound cards, etc.

Processor 102 is typically a commercially available processor, such as the Pentium microprocessor from Intel Corporation, PowerPC microprocessor, SPARC processor, PA-RISC processor or 68000 series microprocessor. Many other processors may also be used. Such a processor usually executes a program referred to as an operating system 114, such as the various versions of the Windows operating systems from Microsoft Corporation, the NetWare operating system available from Novell, Inc., or the Unix operating system available from many vendors such as Sun Microsystems, Inc., Hewlett-Packard Company and AT&T. Operating system 114 controls the execution of other computer programs such as a graphical user interface (GUI) 116 and the instrument control pulse manager 118 of the present invention, and provides scheduling, input-output control, file and data management, memory management, and communication control and related services. Processor 102 and operating system 114 define a computer platform shown by dashes block 101, for which application programs in high level programming languages are written. The functional elements of the digital oscilloscope 100 communicate with each other via bus 120.

Digital oscilloscope 100 includes a signal acquisition system 122, a scope interface 124 and video controller 126. Signal acquisition system 122 includes scaling and conditioning 128 that receives input signals through channel inputs 130. Scaling and conditioning unit 128 and acquisition unit 132 include well-known high frequency electronics for signal acquisition, signal conditioning, and analog-to-digital conversion, all of which are controlled by computer system 101 and are considered to be well-known in the art. Timebase 134 drives the analog-to-digital conversion process performed in acquisition 132, specifying when to sample the input signals and how many samples are to be taken. Trigger 136 synchronizes the acquisition process through timebase 134, enabling an operator to arrange a trigger event to obtain a stable waveform display of the desired features of one or more of the input signals. Trigger 136 may be based upon a line sync or auxiliary trigger input, as is well known in the art.

Waveform analyzer 138 performs measurement processes for developing the waveform for display. It contains hardware and software to perform well-known operations such as setting the analog-to-digital codes for acquisition unit 132 and mapping the resulting digital information to the physical pixel locations which are ultimately presented on display 112 under the control of GUI 116. Pointing device 110 and/or the keyboard 108 are used to move a cursor on GUI-controlled display 112 to select display elements under the cursor. Pointing devices 110 may include any number of pointing devices such as a mouse, trackball, touchscreen or joy stick. Of course, the cursor may be controlled with one or more keyboards 108 located externally or integrated into a front panel of digital oscilloscope 100. Some embodiments of digital oscilloscope 100 also include a voice control capability such as that described in commonly-owned U.S. Patent Application entitled "VoiceResponsive Command and Control System and Methodology For Use In A Signal Measurement System" naming as inventors Jay A. Alexander and Michael Karin, filed on Aug. 30, 1999 under Ser. No. 09/386,531, the specification of which is hereby incorporated by reference herein in its entirety.

Scope interface card 124 includes a video controller 140 that controls the rendering of pixels into the waveform random access memory (RAM) 142. It also receives display element control commands and cursor input information from the front panel keyboard 108 and the pointing device(s) 110. Waveform memory includes a data structure for each pixel location on display 112. The data structures contain information regarding every display element that is to be drawn at each pixel location. Although there may be multiple display elements which are to be drawn at a given pixel location, only one color may be rendered at that location. Waveform memory supplies the priority encoder 144 with this information. Priority encoder 144 prioritizes the competing display elements. For example, if an operator arranged a marker and a waveform such that they are located in the same pixel location, then priority encoder 144 selects that display element with a highest predetermined priority. In such an example, the color of the marker is rendered at the pixel location providing a display that appears to show the marker over the waveform. Priority encoder 144 then sends the selected color to VRAM 146 which then causes the pixel to be rendered in the indicated color.

Video system 126 includes a dynamic random access memory (DRAM) 148 which contains data specifying a color for each pixel in the display 112. Likewise, video random access memory (VRAM) 146 also contains data specifying a color for each pixel in display 112. Computer system 101 controls the information in DRAM 148 while signal acquisition system 122 controls information in VRAM 146. For each pixel in display 112, controller 150 selects whether the pixel in display 112 is specified from VRAM 146 or DRAM 148. In general, information in VRAM 146 includes digitized waveforms being generated by signal acquisition system 122 with high rates of change that are much too fast for software processing by computer system 101 for real-time display of the waveforms on display 112.

Video system 126 includes a controller 150 and a multiplexer 152. Controller 150 controls which of the two inputs to multiplexer 152 are processed into display signals for transmission to display 112 under the control of graphical user interface 116. Controller 150 typically monitors color data sent from DRAM 148 and may be programmed to switch multiplexer 152 to a different input when a particular programmed color is received from the DRAM 148. A rectangular pixel area is typically defined within DRAM 148 with the programmed color, typically dark gray. The programmed color is not displayed, but instead serves as a data path switch control for multiplexer 152. Therefore, within the programmed color rectangle, display data comes from VRAM 146. When various control functions are needed, an interactive dialog box is drawn within the programmed color rectangle. In an alternative embodiment, VRAM 146 and video system 126 can be implemented with a commercially-available, high performance computer graphics subsystem card. Such an implementation would not contain dual sets of memory and a multiplexer as described above. Such a graphics subsystem would write data directly into a RAM for subsequent display on display device 112.

It should also be understood that the above system architecture is exemplary only and that the present invention is not limited to being implemented in this or any other particular system architecture. In one embodiment, digital oscilloscope 100 is an Infiniium™ digital oscilloscope available from Agilent Technologies, Inc. (Infiniium is a trademark of Agilent Technologies, Inc.)

Pulse manager 118 is a system for use by an operator that automatically performs measurements on as many as all pulses of an acquired signal stored in acquisition memory. Pulse manager 118 also generates an accessible data structure that stores characteristics of the chosen subset of acquired signal pulses, including pulse measurement results. Providing a searchable data structure of acquired pulse characteristics facilitates the implementation of a simple and intuitive apparatus and associated methodology for searching, sorting and otherwise manipulating the pulse characteristics to gain an understanding of the acquired signal.

Furthermore, pulse manager 118 searches the data structure for pulses of the acquired signal that satisfy operator-provided search criteria. Additional capabilities associated with the searching of data in an accessible database may also be included. For example, in certain disclosed embodiments, the operator can sort the selected pulses (that is, the pulses that satisfied the search criteria) in any desired manner by specifying a desired sort criteria. Pulse manager 118 may also display selected pulses along with the associated measurement results, and enables the operator to advance through the selected pulses in any manner desired to display different pulses together or separately. Such capabilities enable the operator to achieve insights into the acquired signal not available with conventional systems.

Thus, pulse manager 118 advantageously provides an operator with the capability to gain insights into a large number of acquired pulses through the selection of individual pulses meeting desired characteristics or relative time of occurrence, through the filtering or selection of pulses meeting specified criteria, and through the arrangement of those pulses according to the same or different criteria. These and other pulse management functions give an operator of a signal measurement system control over acquired signals not provided heretofore.

Figure 2:
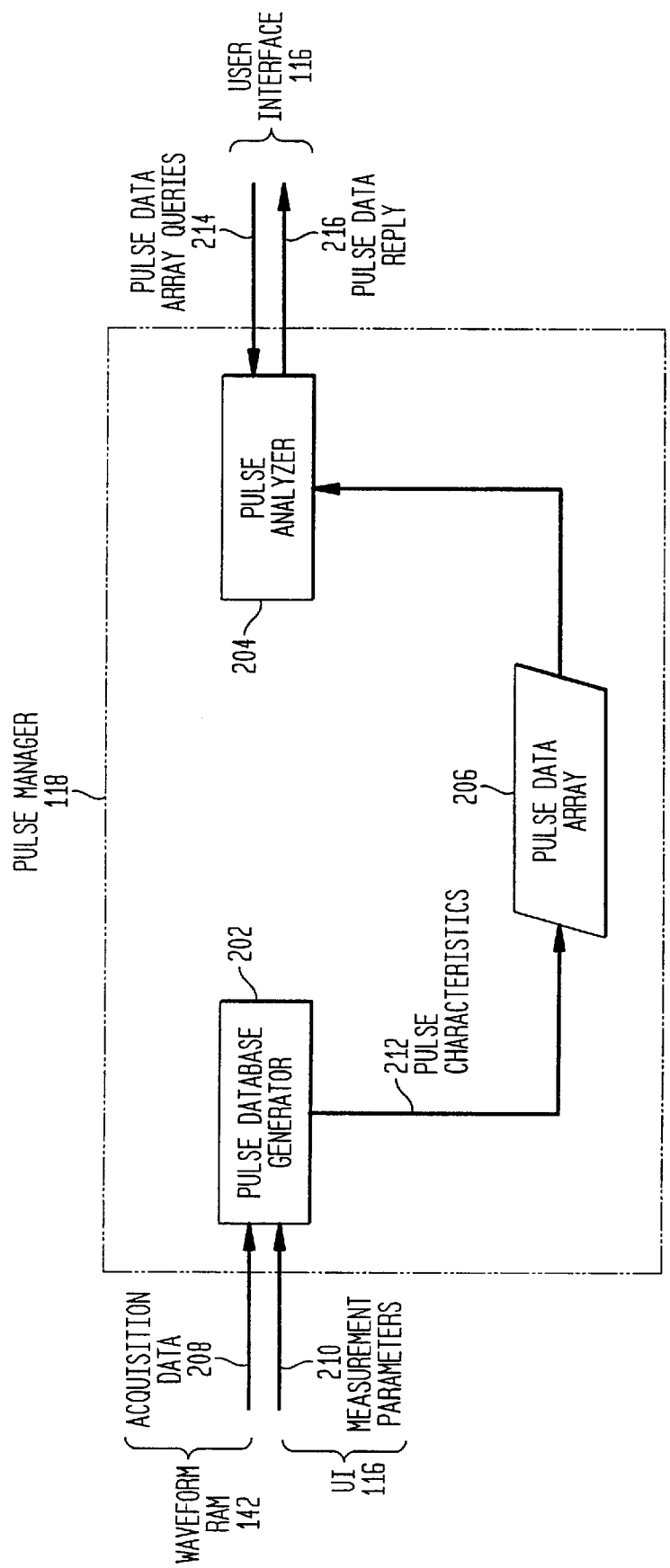
FIG. 2 is a high-level block diagram of one embodiment of the pulse manager of the present invention.

In one embodiment, pulse manager 118 is implemented in software routines which interoperate with the components of signal measurement system 100 to perform the operations of the present invention. Such software routines typically reside in memory 104 andlor disk storage devices, and may be stored on any other computer-readable medium such as, for example, magnetic disk, compact disc or magnetic tape, and may be loaded into digital oscilloscope 100 using an appropriate peripheral device as known in the art. Preferably, this embodiment of pulse manager 118 is implemented in any well-known procedural or object-oriented programming language such as C or C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The pulse manager may be implemented, for example, in dedicated hardware, firmware, or any combination thereof III. Functional Description of Exemplary Embodiments A. High-Level Description A high-level functional block diagram of one embodiment of pulse manager 118 implemented in digital oscilloscope 100 is shown in FIG. 2. Pulse manager 118 has access to acquisition data 208 stored in an acquisition memory that is part of acquisition block 132 illustrated in FIG. 1. A preferred implementation of pulse manager 118 operates with a user interface such as graphical user interface 116 to receive measurement parameters 210 to guide the pulse measurements and to provide a graphical interactive environment in which the operator can manipulate or otherwise analyze the pulse characteristics 212 stored in pulse data array 206.

Generally, pulse manager 118 comprises two primary operational components and a novel data structure of pulse characteristics 212. A pulse database generator 202 performs, with minimal or no operator involvement, a series of one or more pulse measurements on acquired data 208 stored in acquisition memory. The results of such pulse measurements are stored in an accessible data structure 206 of pulse information, referred to as pulse data array 206. A pulse analyzer 204 searches pulse data array 206 in accordance with operator queries 214, and displays on user interface 116 the results 216 of the requested queries 214.

Specifically, pulse database generator 202 performs automatically pulse measurement operations on acquisition data 208 in accordance with measurement parameters 210. Depending on the manner in which such measurement parameters 210 are provided to pulse database generator 202, the pulse measurement operations may be performed with minimal or no operator involvement. Pulse characteristics 212 generated by pulse database generator 202 primarily include the results of such pulse measurement operations. Such measurements may include, for example, rise time, fall time, period, peak-to-peak voltage, overshoot and undershoot, minimum and maximum voltages, AC and DC RMS voltages, pulse area, pulse width, frequency, duty cycle, and any other desired pulse measurements.

In one embodiment described below, pulse database generator 202 also performs statistical analyses on the pulse measurement results to provide a broader view into the behavior exhibited by acquired data 208, and provides the results of such statistical analyses to pulse data array 206. This is described in detail below. Additional pulse characteristics described below are also generated by pulse database generator 202 for storage in pulse data array 206. The automatic performance of numerous pulse measurements on numerous pulses eliminates the enormous number of operator actions that would otherwise be required to invoke such measurements, and to subsequently store the results of those measurements.

Pulse data array 206 is an accessible data structure storing, among other things, signal pulse characteristics each associated with a particular pulse of acquired data 208. The structure of pulse data array 206 and/or the arrangement of data within pulse data array 206 are such that certain associations of data are maintained. There is a unique pulse number assigned to each pulse in acquisition data 208 that uniquely identifies the associated pulse. Preferably, the pulse number also specifies the sequential occurrence of each pulse relative to the other pulses acquired during the same signal acquisition event. Associated with each such pulse number, pulse characteristics 212 are obtained directly or indirectly from acquisition data 208. In particular, pulse characteristics 212 stored in pulse data array 206 include the results of the pulse measurements performed by or under the control of pulse database generator 202.

In addition, associated with each pulse identifier, pulse data array 206 can include the type of pulse (described below) and the time the pulse occurred relative to the trigger event that caused the capturing of acquisition data 208. As noted, in the embodiments disclosed herein, acquisition memory can store acquisition data 208 for more than one acquisition for a given channel or source. In such embodiments, pulse data array 206 is constructed such that all of the pulse characteristics are associated with an acquisition identifier indicating the acquisition event and input channel on which the pulses were acquired. Preferably, pulse data array 206 further includes the results of the statistical measurements. In embodiments in which pulse data array 206 includes pulse characteristics for data acquired during more than one acquisition, such statistical measurements are associated with the acquisition over which the statistical analyses are performed.

The consolidation of pulse measurement results and other pulse characteristics in an accessible database provides a repository of characteristic data that was heretofore unavailable to the operator. In addition, the storage of such pulse characteristics in an accessible data array provides the operator with significant capabilities to search and sort the pulse characteristics to gain insights into the behavior of the system or circuit being evaluated. The operator achieves this by generating pulse data array queries 214 through user interface 116. Pulse data array queries 214 are processed by pulse analyzer 204 as described below to generate pulse data reply 216.

Specifically, pulse analyzer 204 searches pulse data array 204 for pulses that satisfy an operator-generated search criteria. Similarly, pulse analyzer 204 sorts the selected subset of pulses based on an operator-generated sort criteria. Pulse analyzer 204 provides the operator with a graphical user interface environment in which the operator may specify the search and sort criteria and in which pulse analyzer 204 may display the selected pulses with their associated pulse measurement results. Pulse analyzer 204 can also display the results of the search and sort operations, and other information related to pulse data array 206 that is related to the operator's investigation into the acquired signal. In accordance with one embodiment of the invention, pulse data array query 214 includes queries for measurement statistics 324, and reply 216 includes the requested statistics.

There are numerous benefits provided by pulse analyzer 204 of the present invention. First, pulse analyzer 204 enables the operator to search the data structure 206 of pulse measurement results using any desired search criteria. Any number of searches can be performed in any combination and the results can be sorted, filtered, arranged or otherwise manipulated by the operator using well known data manipulation functions to provide the operator with insights into the pulse characteristics from any desired perspective. As will be described below, the operator can cause the display of a specific pulse or those pulses that satisfy the search criteria with minimal operator actions. An assortment of pulse measurement results are displayed with the specified pulse to provide the operator with a range of data not provided by conventional signal measurement systems. There are numerous other advantages provided by pulse manager 118, some of which are noted elsewhere herein.

Figure 11:
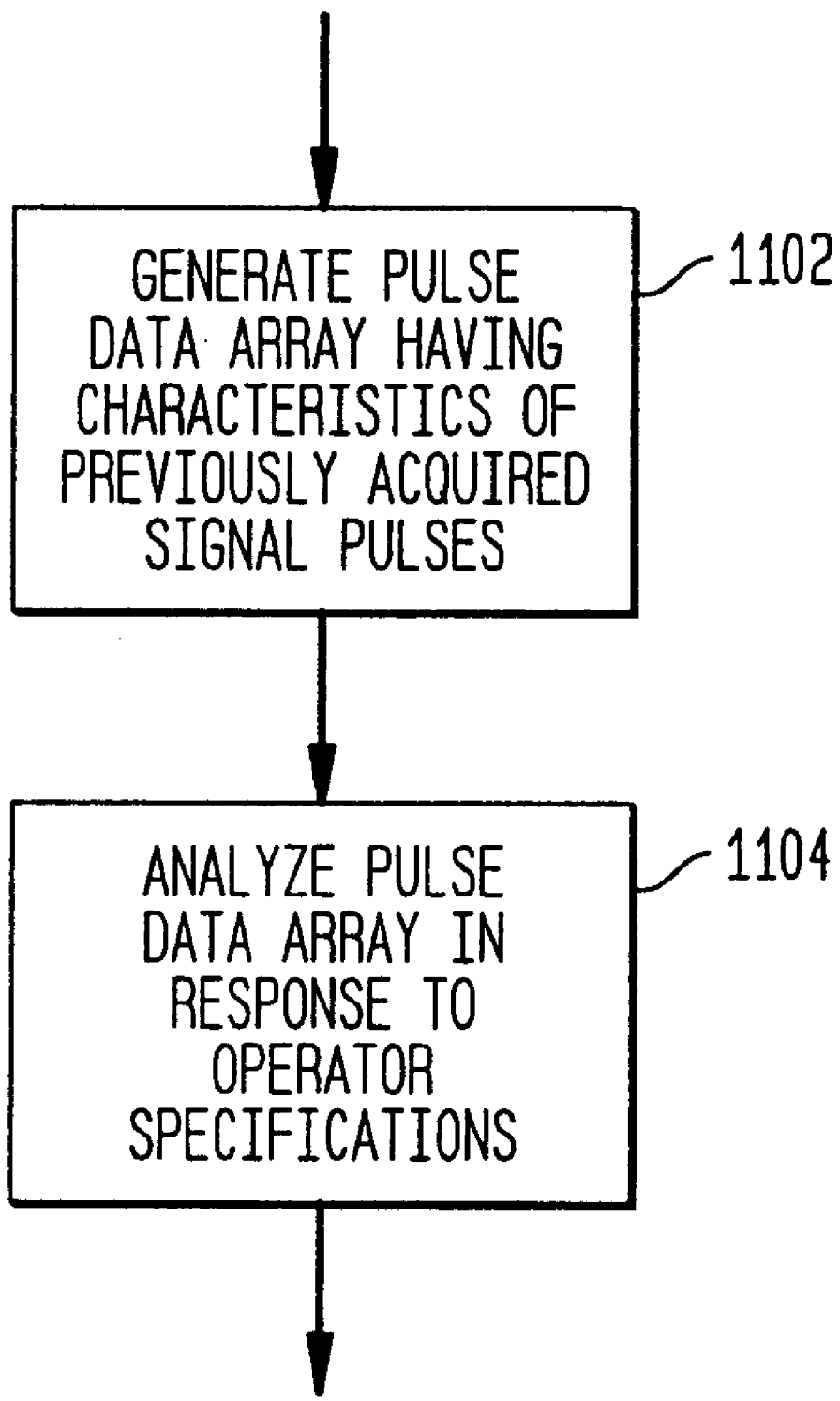
FIG. 11 is a flow chart of the processes performed by one embodiment of the pulse manager.

FIG. 11 is a high-level flow chart of the processes performed by pulse manager 118 in accordance with one embodiment of the present invention. At block 1102, pulse manager 18 generates a pulse data array 206 having stored therein pulse characteristics of a previously acquired signal. At block 1104, the contents of the pulse data array are analyzed in response to operator specifications. The operations performed in blocks 1102 and 1104 are described in detail below.

B. Pulse Database Generator 202

Figure 3:
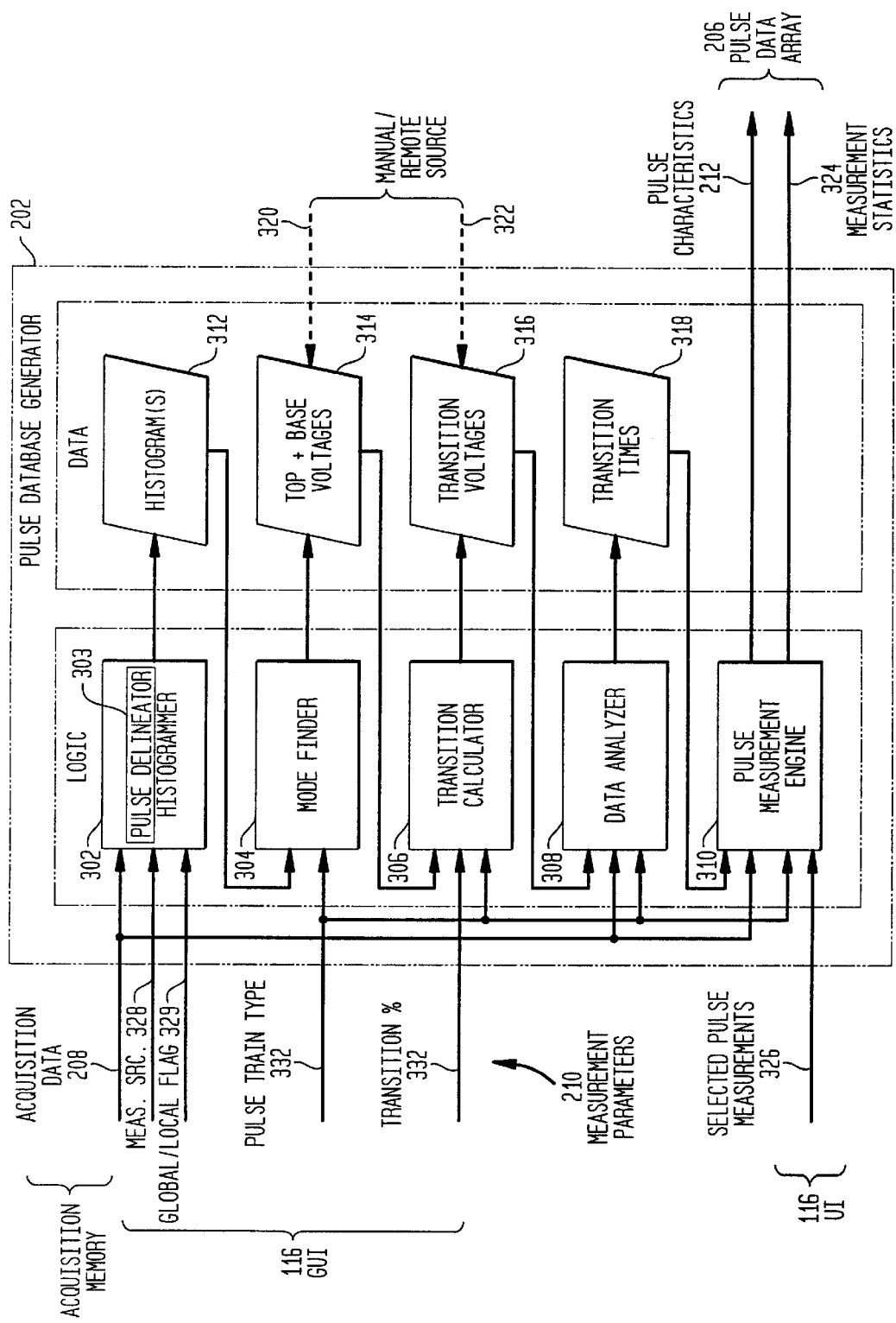
FIG. 3 is a functional block diagram of the pulse database generator illustrated in FIG. 2 in accordance with one embodiment of the, present invention.

FIG. 3 is a functional block diagram of pulse database generator 202 in accordance with one embodiment of the present invention. As noted, pulse database generator 202 processes raw acquisition data 208 in accordance with measurement parameters 210 to generate pulse characteristics 212. In the following description, the acquired input signal is a voltage signal. It should be understood, however, that the present invention applies to any type of acquired signal, such as current signals. For ease of description only voltage signals and pulses are referenced herein. The sampling of an input signal and the format of the sampled signal values in acquisition memory is considered to be well-known in the art and is not described further herein.

Pulse database generator 202 primarily performs one or more pulse measurement operations. In one embodiment, such pulse measurements are predetermined and include those measurements likely to be required by an operator under most test and evaluation conditions. In other embodiments, the operator can specify the pulse measurements that are to be performed. The operator may provide such information when oscilloscope 100 is set up or initialized. This is described in greater detail below. As noted, the results of such individual pulse measurements are represented by pulse characteristics 212 that are generated by pulse database generator 202 for storage in pulse data array 206.

In the illustrative embodiment, additional pulse characteristic information beyond pulse measurement results is provided by pulse database generator 202 for storage in pulse data array 206. Here, such additional pulse measurement information includes measurement statistics 324. As noted, measurement statistics 324 are global statistics of individual pulse measurements, resulting from statistical analyses performed on pulse characteristics 212.

The illustrated components of pulse database generator 202 are provided in this embodiment of the invention to enable pulse database generator 202 to perform pulse measurement operations and statistical analyses with no operator involvement beyond providing measurement parameters 210. Thereafter, pulse database generator 202 performs pulse measurements automatically. In other embodiments, some or all measurement parameters 210 can be provided in a set-up or initialization file. Alternatively, pulse measurement parameters 210 can be fixed values, or default values for parameters 210 can be established, further reducing operator involvement. Measurement parameters 210 may also provide pulse database generator 202 with additional information which would otherwise be calculated by pulse database generator 202, thereby eliminating the need to perform certain intermediate operations. This is described in detail below.

To perform the various signal pulse measurements a number of processes are performed by components of pulse database generator 202 to determine requisite signal or reference values that are considered in the determination of the pulse measurement value. For example, many signal pulse measurements reference the amplitude of the voltage pulse. The amplitude of the voltage pulse, therefore, is an intermediate value calculated by pulse database generator 202. One pulse measurement 212 that utilizes this intermediate value is rise time. In many standards, rise time is defined as the time difference between when the signal level attained by the rising edge of the pulse is 10% and 90% of the pulse amplitude.

The amplitude of a pulse is defined as the difference between the "steady state" voltages associated with the high and low states of the measured pulse, referred to as the top and the base voltage levels, $V_{top}$ and $V_{base}$. In other words, the top and base voltage values are the voltage levels attained by a signal after the effects of overshoot and undershoot conditions have passed; that is, the 0% and 100% amplitude values. This is in contrast to the minimum and maximum voltages, $V_{min}$ and $V_{max}$, which are the least and greatest voltage values that occur during a pulse. These values are used in computing the undershoot and overshoot measurements, respectively.

Thus, to perform the pulse measurement operations, this embodiment of pulse database generator 202 includes a histogrammer 302 that processes acquisition data 208 to generate one or more histograms 312 of the distribution of the acquired signal voltage levels. A mode finder 304 processes histograms 312 to determine the voltages 314 for each logical state of the measured pulse in the acquired signal, including the top and base voltage levels. A transition calculator 306 determines the voltages 316 at each specified transition percentage 332, such as the 10%, 50% and 90% levels, of the pulse amplitude. A data analyzer 308 processes acquisition data 208 to determine the times at which each of these transitions occurs, referred to herein as transition times 318. In this illustrative embodiment, pulse database generator 202 includes a pulse measurement engine 310 that performs pulse measurements on acquisition data 208 utilizing transition times 318. The results of these pulse measurements are stored in pulse data array 206 as pulse characteristics 212. In addition, the noted global statistics of these pulse measurements are also calculated by pulse measurement engine 310 and provided to pulse data array 206 as measurement statistics 324. The functions and operations performed by each of these functional components or subsystems of pulse database generator 202 are described below.

For ease of description, the following simple example will be referenced throughout this description of pulse database generator 202. Digital oscilloscope 100 is used to acquire signals from a digital circuit. The acquired signal represented by acquisition data 208 is a voltage signal having 2 logical states. That is, the acquired signal is nominally a square wave that is specified to alternate, for this example, between approximately 0.0 volts and approximately 5.0 volts. In the example, acquisition data 208 stored in acquisition memory includes 1075 pulses of this acquired signal.

1. Histogrammer 302

Acquired data 208 is processed initially by a histogrammer 302. Histogrammer 302 generates one or more histograms 312 utilized by other components of pulse database generator 202. Histograms 312 are typically tables stored in memory that list the quantity of samples of an acquired signal that take on a particular voltage value. These data are often plotted as a function of the voltage value. It is these distributions of voltage values that are analyzed in subsequent operations of pulse database generator 202. There are a number of well-known techniques that can be implemented by histogrammer 302 to generate histograms 312. As such, further details regarding the functions performed by histogrammer 302 are not provided herein. It should also be appreciated that histogrammer 302 utilizes the acquired samples to generate a histograms 312 with a resolution suitable for subsequent use by mode finder 304. In one embodiment, histogrammer 302 utilizes all samples of acquired signal 208 for simplicity and maximum accuracy.

As shown in FIG. 3, histogrammer 302 retrieves acquisition data 208 from the acquisition memory. The acquisition memory may include acquired signals from more than one channel of digital oscilloscope 100. As such, one measurement parameter 210 is a measurement source specification 328. Depending on the measurements desired, measurement source specification 328 might contain a primary source identifier and an auxiliary source identifier. In addition, in certain embodiments, the acquisition memory can store signal data associated with more than one acquisition for a given channel or plurality of channels.

Measurement source 328 uniquely identifies the acquisition signal data in the acquisition memory that is to be processed by pulse database generator 302. In embodiments such as those noted above, to uniquely identify acquisition data 208, measurement source 328 identifies the specific channel and acquisition event resulting in the capture of the desired acquisition data 208. In alternative embodiments, additional or less information is provided to histogrammer 302 depending on the function and structure of the acquisition memory. For example, in one application, at any given time, the acquisition memory stores acquisition data 208 associated with a single channel. In such circumstances, measurement source 328 need not be provided.

In certain situations, an operator desires to use uniform top and base levels for all measured pulses. When global/local flag 329 is set to the "global" state, a single global histogram is created for use my mode finder 304. To provide for individual top and base levels for each pulse, histogrammer 302 preferably includes a pulse delineator 303. Pulse delineator 303 determines the boundaries of individual pulses when global/local flag 329 is set to the "local" state. Pulse delineator 303 first determines the overall minimum and maximum values of all acquired data 208. Then, the nominal medial (50%) value is calculated. The times the acquired data transitions through this value are then determined. A minimum amplitude requirement is used to control to effects of sampling uncertainty or internal noise. In a two logical state square wave, the transitions signify rising and falling edges of each pulse. Successive pairs of the crossing times are identified, with the mid-point between the falling edge and the rising edge calculated as the pulse boundary at the baseline level. These boundaries are then used by histogrammer 302 to develop a histogram of each acquired signal pulse as described above.

Pulse delineator 303 first determines the overall minimum and maximum values of all acquired data 208. Then, the nominal medial (50%) value is calculated. The times the acquired data transitions through this value are then determined. A minimum amplitude requirement is used to control to effects of sampling uncertainty or internal noise. In a two logical state square wave, the transitions signify rising and falling edges of each pulse. Successive pairs of the crossing times are identified, with the mid-point between the falling edge and the rising edge calculated as the pulse boundary at the baseline level. Returning to the example noted above, measurement source 328 identifies the desired acquisition data 208 that includes samples of the acquired square wave. Histogrammer 302 processes acquisition data 208 to generate bimodal histograms 312 since the acquired signal has two states, top and base voltages, that have logical representations and, therefore, are signal levels maintained for some time during each pulse of the acquired signal.

2. Mode Finder 304

Mode finder 304 processes histograms 312 to identify the histogram modes. The modes of histograms 312 are the dominant portions of the voltage distribution; that is, the most frequently occurring voltage values of the distribution of voltage level occurrences. The center of each mode of histogram 312 identifies a voltage value that the acquired signal pulse achieves during steady state behavior. In other words, mode finder 304 attempts to avoid signal perturbations such as the overshoot and undershoot conditions that often occur in a pulse train.

As shown in FIG. 3, one measurement parameter 210 provided by the operator through user interface 116 is referred to as pulse train type 330. Pulse train type 330 identifies the type of acquired signal and, thus, the number of signal levels which have a logical representation. In the illustrative application of a nominal square wave with two logical states, the modes identify the top and the base voltages 314; that is, $V_{top}$ and $V_{base}$, respectively. In other words, mode finder 304 identifies two modes of histogram(s) 312. Mode finder 304 assigns the mode occurring at the lower voltage as being the base voltage and the mode occurring at the higher voltage as being the top voltage. There are well-known techniques for determining the modes of a histogram, any one of which may be implemented by mode finder 304.

It should be apparent to those of ordinary skill in the art that mode finder 304 can be configured to identify any number of modes of histogram 312 depending on the type of acquired signal 208. For example, in one alternative embodiment, acquisition data 208 may include a pulse train from a communication signal that transitions between three signal states. Such a signal is identified by pulse train type 330 as an alternate mark inversion or AMI signal. AMI signals include pulses having two signal levels of opposing polarity having a logical representation. The signal also includes a zero voltage level shared by the two opposing signal levels. This arrangement enables an AMI signal to achieve an average voltage of zero. For such signals, histograms 312 are processed by mode finder 304 to identify three modes. It should be understood that mode finder 304 can identify additional histogram modes. For example, acquired signal 208 can have pulses of opposing polarity, which do not share a common zero voltage level. In such circumstances, there may be four logic levels and, hence, four histogram modes that are identified by mode finder 304.

In addition, it should be understood that the modes of histogram 312 may not be well defined and clearly identifiable. In such circumstances, mode finder 304 may include logic that implements a smoothing function to identify a histogram mode with maximum accuracy. For example, if there are two adjacent modes of substantially equal magnitude, mode finder 304 may perform weighted averaging functions and the like to calculate the represented mode.

In an alternative embodiment, the operator may provide global top and base voltages 314, as illustrated by dashed line 320. As with measurement parameters 210, such information can be provided by the operator through user interface 116, as shown, or through some form of initialization or set-up process. For example, such logic levels may be provided by the chip or circuit board manufacturer. In such circumstances, it is not necessary and may not be desirable to calculate the top and base voltages 314. Rather, such specified values can be provided by the operator for subsequent processing by pulse database generator 202.

In another embodiment, the signal pulses may have erratic or unusual shapes. This may lead histogrammer 302 to generate erroneous results. This, in turn, can lead mode finder 304 to calculate incorrect values for top and base voltages 314. To avoid such circumstances, the operator may choose to provide top and base voltages 314 directly to pulse database generator 202. Top and base voltages 314 may be provided by the operator through any known technique, such as through some form of data transfer, through user interface 116, etc. In such embodiments, pulse database generator 202 may not include histogrammer 302 and mode finder 304 since the operations performed by histogrammer 302 and mode finder 304 need not be performed.

It should be understood that the type, number and structure of the data structure(s) that store top and base voltages 314 could take on any form. A single indexed data structure of top and base voltages for each pulse in acquired signal 208 may be implemented. Alternatively, separate data structures, one for each identified mode, can be implemented. That is, all the top voltages 314 are stored in one data array while all the base voltages 314 are stored in another. Pulse number may index each such data array, for example. In cases when global top and base levels are used, arrays are not necessary.

Continuing the above example, pulse train identifier 330 identifies acquired data 208 as representing a signal having two logical states. Mode finder 304 processes histograms 312 and identifies two modes and the center of each mode for each histogram. In this example, the center voltages are approximately 0 volts (the base voltage) and 5 volts (the top voltage). These voltage values for each of the 1075 pulses are stored in memory as top and base voltages 314.

3. Transition Calculator 306

As noted, transition calculator 306 determines the voltage values associated with certain, predetermined locations on each pulse that have significance in determining the pulse measurements. In particular, the pulse measurements utilize the signal voltage at certain threshold levels as the signal transitions between the "steady state" values identified by mode finder 304. The threshold values commonly considered when performing signal measurement are 10%, 50% and 90% levels of the pulse amplitude. Other standards may require the use of 20%, 50% and 80% levels, just the 10% and 90% levels, etc. These thresholds are referred to herein as transition percentages 332 and the associated voltages are referred to as transition voltages 316.

In the illustrative embodiment, transition percentages 332 are provided by the operator through user interface 116 as part of measurement parameters 210. It should be understood, however, that transition percentages 332 can be provided to transition calculator 306 in any other manner, such as part of a set-up or initialization file or procedure. Alternatively, transition percentages 332 may be retrieved by transition calculator 306 from a predetermined location in which such values are stored based on the type of acquisition being performed or device being tested.

In an alternative embodiment, the operator can provide global transition voltages 316, as illustrated by dashed line 322. Such circumstances may arise, for example, when the operator is testing a device against specific manufacturer's specifications. In such embodiments the operations performed by histogrammer 302, mode finder 304 and transition calculator 306 need not be performed. Pulse database generator 202 may, therefore, not include these subsystems. As with top and bottom voltages 314 above, transition voltages 316 may be provided by the operator through any known data transfer or data entry technique.

In the illustrative embodiment, transition calculator 306 computes transition voltages 316 using top and base voltages 314, the type of pulse, as identified by pulse train type 330, and the specified transition percentages 332, provided as part of measurement parameters 210. From top and base voltages 314, the pulse amplitude of each pulse can be calculated. The transition voltages 316 are then calculated to be the voltages corresponding to the specified percentages of the pulse amplitude.

It should be understood that the type, number and structure of the data structure(s) that store transition voltages 316 can take on any form. A single data array of three or more voltage values (10%, 50% 90%) for each pulse may be implemented. Alternatively, separate data structures, one for each identified transition threshold (proximal, medial and distal, for example) can be implemented. That is, all 10% voltage values are stored in one data array; all 50% voltage values are stored in a second data array; and all 90% voltage values are stored in a third data array. In cases where global transition voltages are used, arrays are not necessary. Note that global top and base levels imply global transition voltages.

Referring once again to the example introduced above, the top and base voltages of the bimodal pulse train of 1075 pulses were determined to be 0.0 and 5.0 volts. Transition calculator 306 as 5.0 volts, then, calculates the voltage amplitude. If the transition percentages 332 are 10%, 50% and 90%, transition calculator 306 would determine that transition voltages 316 would be 0.5, 2.5 and 4.5 volts, respectively, for the measured pulse.

4. Data Analyzer 308

As noted, data analyzer 308 processes acquisition data 208 to determine the times of occurrence of each transition voltage 316 for all measured pulses in acquisition data 208. Data analyzer 308 receives pulse train type 330 and accesses acquisition data 208 to retrieve the transition voltages 316 generated by transition calculator 306. Each pulse of a square wave attains a particular transition voltage 316 twice, once on the rising edge and once on the falling edge.

In certain embodiments, data analyzer 308 implements additional logic to insure that when a transition voltages 316 is achieved by a pulse, it is not a perturbation but a true indication of the pulse transition. For example, in one embodiment, data analyzer 308 may manage a window of voltage values before and after a transition percentage to verify, for example, that the top voltage was achieved before the second occurrence of a transition voltage is achieved. That is, the top of the pulse cannot occur after the falling edge of the pulse. Other verifications apparent to those of ordinary skill in the art may be implemented as well. The extent and complexity of such verification procedures can vary according to the integrity of acquisition data 208.

As with top and base voltages 314 and transition voltages 316, transition times 318 may be stored in one or more data structures of any form appropriate for the performance objectives and other limitations of the particular application. In one embodiment, for each transition voltage, an array of time values at which the acquired signal pulses achieved the transition voltage is stored in a single data array. Thus, in the three-transition percentage example above, there would be three such data arrays, one for the 10% voltage, 50% voltage and 90% voltage thresholds.

Continuing the noted example, transition times 318 include three arrays, each with an ordered list of 2150 time entries (two for each of the 1075 pulses). The first array would have stored therein the times the acquired signal transitions through 0.5 volts on both, the rising and falling edges of the square wave pulse. Similarly, the second array would have stored therein the time values associated with the rising and falling edges of each pulse attaining at 2.5 volts. The third array, 4.5 volts.

5. Pulse Measurement Engine 310

In this illustrative embodiment, pulse database generator 202 includes a pulse measurement engine 310 that performs one or more measurement operations, generating measurement results for storage in pulse database 206. Such measurements may include, for example, rise time, fall time, period, peak-to-peak voltage, overshoot and undershoot (also known as preshoot), minimum and maximum voltages, AC and DC RMS voltages, pulse area, pulse width, frequency, duty cycle, and any other desired pulse measurements.

Pulse measurement engine 310 performs these calculations utilizing transition times 318, acquisition data 208 and pulse train type indication 330.

For example, rise time is the difference between the two transition times 318 at which the rising edge of a signal pulse achieved the transition voltages 316 associated with the 10% and 90% transition voltages 316. For other measurements, pulse measurement engine 310 surveys acquisition data 208 associated with the measured pulse to determine the specific value. For example, overshoot on a positive pulse is the difference between $V_{max}$ and $V_{top}$ divided by the quantity $V_{top}$ and $V_{base}$, and expressed as a percentage. It should be understood that pulse measurement engine 310 utilizes well-known techniques to perform the measurement operations. Thus, the details of each measurement are not described further herein. It should be understood, however, that it is contemplated that digital oscilloscope 100 and other signal measurement systems in which the present invention can be implemented already perform pulse measurement functions. In such applications, it is preferred that pulse database generator 202 include the capability of invoking such pulse measurements in lieu of a pulse management engine 310 which would essentially duplicate such functions.

In the exemplary embodiment illustrated in FIG. 3, pulse database generator 202 also generates measurement statistics 324. Measurement statistics 324 include global statistical values that provide insight into the acquired data 208 as a whole rather than an individual pulse. Such information serves many purposes including, for example, providing norm or average reference values when analyzing individual signal pulses. Measurement statistics include for example, the maximum, minimum, mean, mode, median and standard deviation of each signal pulse measurement. Preferably, pulse measurement engine 310 calculates measurement statistics 314 as pulse characteristics 212 is generated. As one of ordinary skill in the art would find apparent, such statistical analyses can be performed during or after the pulse measurements are performed on all pulses of the acquired signal.

In one embodiment of the invention, pulse measurement engine 310 performs a predetermined set of signal pulse measurements to generate pulse characteristics 212. In an alternative embodiment, the operator can determine which measurements are to be performed. Such measurements are provided by the operator to pulse database generator 202 as part of measurement parameters 210. This is illustrated in FIG. 3 as selected pulse measurements 326 received from user interface 116. One example of a dialog box that is generated on display device 112 through graphical user interface 116 to provide the operator with capability to make such a selection is shown in FIG. 8.

Figure 8:
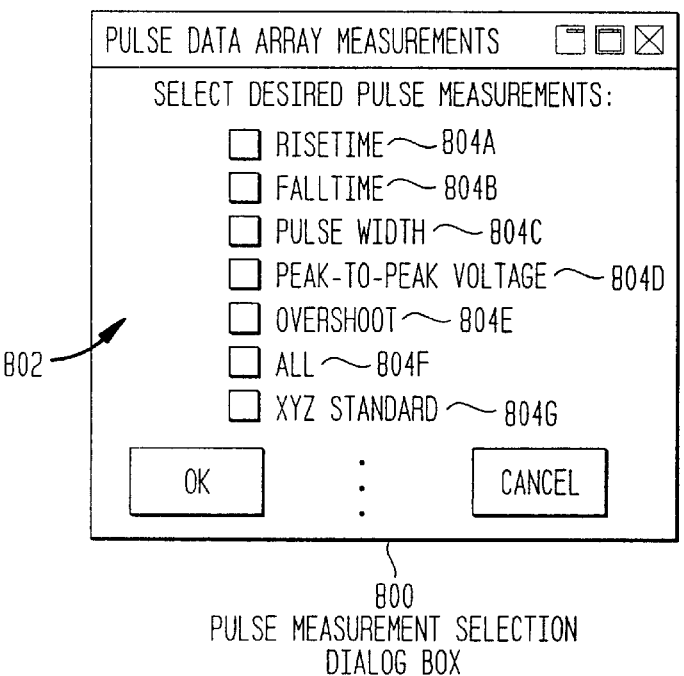
FIG. 8 is an illustration of a dialog box or window displayed on the user interface to enable the operator to select which measurements are to be performed by the pulse database generator in accordance with one embodiment of the present invention.

Referring now to FIG. 8, dialog box 800 provides a series of checkboxes 802 each associated with one or more a signal pulse measurement identifiers 804. In the embodiment shown, certain check boxes are mapped to a single signal measurement, such as rise time 804A and fall time 804B. Other checkboxes are mapped to more than one signal measurement. For example, measurement selection 802F is mapped to all signal measurements, as indicated by the identifier 804F of "All."

To further facilitate operator selection of signal measurements, additional check boxes can be provided which are mapped to a subset of signal measurements which are necessary to be performed to achieve a desired level of analysis, verify compliance with certain test specifications, or the like. For example, in dialog box 800, measurement selection 804G is mapped to all pulse measurements that should be performed to insure that the XYZ standard is satisfied. Other similar arrangements and display control and selection techniques may be implemented as well.

C. Pulse Data Array 206

As noted, pulse data array 206 is an accessible data structure of signal pulse characteristics generated by pulse data generator 202. Pulse data array 206 has stored therein pulse characteristics 212 and, preferably, measurement statistics 324. In one embodiment, both, pulse characteristics 212 and measurement statistics 324 are generated by pulse database generator 202. Together, this information is collectively referred to herein as pulse information or pulse data. FIG. 4 is a schematic block diagram of pulse data array 206 in accordance with one embodiment of the present invention.

The structure of pulse data array 206 and/or the arrangement of data within pulse data array 206 is such that certain associations of data are maintained. For example, in this illustrative application of digital oscilloscope 100, the operator can perform one or more acquisitions 402 on any available data channel in response to the occurrence of any established set of trigger conditions. During each such acquisition 402, acquisition data 208 is obtained; that is, it is sampled and stored in the acquisition memory. As noted, in signal measurement systems having deep acquisition memories the number of pulses 404 in a single acquired signal can be substantial, perhaps on the order of $10^5$ pulses. The pulse characteristic data stored in pulse data array 206 related to each such acquisition are stored in association with an acquisition number 402 that uniquely identifies the acquisition data 208 stored in the acquisition memory from other acquisition data captured during other acquisitions on the same or different channels.

It is noted that in this illustrative embodiment, acquisition identifier 402 for each acquisition event is a simple integer in FIG. 4 for ease of illustration. It should be appreciated, however, that values other than integers can be used to represent the acquisition in pulse data array 206. For example, a different type of data unit having the structure, size, and other attributes dictated by the implementation can be used. For example, if pulse database generator 202 and pulse analyzer 204 were implemented in the C++ programming language, then pulse data array 206 would be a an array of structures and acquisition number 402 might be the index into the array.

In another embodiment of pulse manager 118, multiple pulse data structures 206 are generated by pulse database generator 202. Each pulse data array 206 has stored therein pulse characteristics 212 associated with a single acquisition 402. Due to the structural and functional separation of such data arrays 206, in such embodiments, no unique acquisition identifier need be stored in each array.

There is a unique pulse identifier assigned to each pulse in acquisition data 208 that uniquely identifies each pulse relative to the other pulses 404 captured in a acquisition 402. As with acquisition number 402, for ease of description, a simple integer pulse number 404 is used to identify each pulse in FIG. 4. It should be understood, however, that in an implemented data structure, pulse number 404 would be of a type dictated by the implemented software program, application, etc. As shown in FIG. 4, there are a total of 1075 pulses captured during the first acquisition 402.

For each pulse number 404, pulse characteristics 212 includes predetermined pulse characteristics that are obtained directly or indirectly from acquisition data 208. In the illustrative embodiment, pulse characteristics 212 includes a type 406 of the pulse corresponding to pulse number 404 and a center time 408 of the pulse corresponding to pulse number 404. Pulse type 406 identifies the corresponding pulse as either being a positive (P) or negative (N) pulse. This is used with acquisition signals having 2 different logical 1 states, such as the AMI communications signal format introduced above. Center time 408 is the time from the trigger event that caused the capturing of acquisition data 208 to the time at which the center of the pulse corresponding to pulse number 404 occurs. In addition, pulse characteristics 212 also includes one or more predetermined pulse measurements 410. Pulse measurements 410 includes the results of any number of signal pulse measurements suitable for the application. In this illustrative embodiment, pulse data array 206 includes for each pulse identified by pulse number 404, the results the pulse measurements 410 of rise time, fall time, pulse width, peak-to-peak voltage and overshoot measurements.

As shown in FIG. 4, pulse characteristics 212 are arranged chronologically; that is, in sequence of occurrence. Thus, pulse number 404 appears sequentially in pulse data array 206, with center time 408 of pulse 1 being less than that of pulse 2, and so on. In the example shown in FIG. 4, pulse 1 has a center time of 1 microsecond, while pulse 2 has a center time 408 of 1.5 microseconds. Pulse measurements 410 for each pulse are stored in association with pulse number 404 corresponding to that pulse. In the example shown in FIG. 4, there are 1075 pulses that were acquired during the first acquisition 402.

As noted, in this embodiment, pulse data array 206 further includes measurement statistics 324. Measurement statistics 324 includes results of statistical measurements performed for one or more pulse measurements 410 for all pulses 404 acquired during an acquisition 402. In the example shown in FIG. 4, this includes a minimum, maximum, mean, mode, median and standard deviation of each measurement 410, although any statistical value may be computed and stored in pulse data array 206.

As noted above with reference to FIG. 2, the operator generates pulse data array queries 214 through user interface 116 that are processed by pulse analyzer 204 as described below to generate pulse data reply 216. In accordance with this embodiment of the invention, pulse data array queries 214 include queries for measurement statistics 324, and reply 216 includes the requested statistics.

It should be appreciated that at least the contents of pulse data array 206, if not the array data structure 206 itself, is generated automatically by pulse database generator 202. In one embodiment of the invention the storing of data in acquisition memory is used to invoke the pulse database generation operations disclosed herein. Alternatively, the operator may invoke operations through a selection of a display element on graphical user interface 116. For example, the operator can select a menu item on a main menu pull-down menu.

The consolidation of such pulse measurements 410 and other pulse characteristics 212 has not heretofore been provided by conventional systems. Traditionally, individual pulse measurements 410 have been performed in response to specific actions taken by an operator for a specified pulse displayed on a waveform display. This single pulse measurement data may or may not have been stored beyond that necessary to display the results of the selected measurement. There has not been any attempt to perform such an extensive analysis on all pulses of acquired data 208 with minimal operator specifications, and to store the results of such pulse measurements in an accessible data structure.

D. Pulse Data Array Generation Process

FIG. 12 is a flowchart of the processes performed by pulse manager 118 to generate pulse data array 206 in accordance with one embodiment of the present invention. At block 1202, data array generation process 1200 begins. Process 1200 may be invoked automatically; that is, without operator intervention, by signal measurement system 100 after a signal is acquired and stored in acquisition memory. Alternatively, process 1200 may be invoked in response to an operator indication to perform pulse analysis operations. Such a request may be provided through any user interface device implemented in the hosting signal measurement system 100. For example, the invocation request may be provided through a softkey selection or dedicated key on front panel keyboard 108. Preferably, in those embodiments in which the operator can directly or indirectly invoke process 1200, such invocation is provided through graphical user interface 116, as noted above. That is, a dialog box button, menu item, icon or other display element is displayed through user interface 116 for graphical selection by the operator.

After block 1202, the operator selects the measurement source at block 1204. In particular, in those signal measurement systems having more than one channel and/or an acquisition memory sufficiently large to store data captured during more than one acquisition, the operator can specify the acquisition data 208 that is to be processed in accordance with the present invention. This selection may occur in response to a dialog box or other user interface display requesting further selection information. Such a request may be displayed in response to the operator invoking process 1200, for example.

In some embodiments, the selection of the measurement source is combined with the invocation request to reduce the number of operator actions necessary to specify the raw acquisition data 208 to be processed by the present invention. In one particular embodiment implemented in signal measurement systems having a single channel, this measurement source identification option is not required. In other embodiments wherein the signal measurement system includes multiple channels but only one channel captures data at any given time, the invocation of process 1200 causes the automatic selection of that channel as the measurement source. In still further embodiments, a default channel may be identified.

As noted, information utilized by pulse database generator 202 when generating pulse characteristics 212 includes the type of pulse train. In the illustrative embodiment, the type of pulse train is received at block 1206. In the embodiments disclosed above, the type of pulse train is provided by the operator. However, it should be understood that this information may be provided by sources other than the operator. For example, the pulse train type may be provided as part of a measurement set-up process that can then be imported into process 1200 for use by pulse database generator 202. Alternatively, the pulse train type may be determined by pulse database generator 202 through some form of analysis of the acquisition data 208. Other approaches now or later developed to identify the type of pulse train may also be used.

At decision block 1208 information may be provided by the operator. The operations that occur thereafter are a function of the types of information that is provided to the operator. That is, information required to perform the noted pulse measurement operations may either be provided by the operator or calculated. In this example, the information provided by the operator could be information made available by the manufacturer of the system or circuit being evaluated or other sources. Such information eliminates the need for pulse database generator 202 to execute certain processes to determine the same information. In this example, the operator is presented with three options in this regard. The first is that the operator provides transition percentages. As noted, transition percentages determine the voltage threshold levels achieved by a pulse rising edge or a pulse falling edge that are utilized to make a pulse measurement. In such a circumstance the series of operations beginning at block 1214 is performed. Another option is that the operator provides global top and base voltages in addition to the transition percentages. This results in the performance of the operations beginning at block 1210. Finally, the operator can provide global transition voltages only, eliminating many of the operations that would otherwise be performed. The three paths through process 1200 are illustrated in three vertical columns, with blocks related to the same or similar data located adjacent to each other.

If the operator provides transition percentages only at block 1208, the processing continues at block 1214 at which the transition percentages are received. In the illustrative embodiment, the transition percentages are provided by the operator through user interface 116. In an alternative embodiment, transition percentages can be fixed values or included in a system configuration file.

One or more histograms of the acquired data are generated at block 1216. In one noted embodiment, each histogram is a table of values stored in memory. The table lists the quantity of samples of the acquired signal that take on a particular voltage value. As noted, there are a number of well-known techniques that can be implemented to generate a histogram of acquisition data 208.

At block 1218, acquisition data 208 is processed to determine the top, base and other voltage levels having logical significance based on the modal distribution of the histograms generated at block 1216 and the type of pulse train received at block 1206. In the illustrative embodiment, this includes the top and base voltage levels. As noted, however, more or less such voltage levels may be determined based on the pulse train type received at block 1206.

The voltages corresponding to the transition percentages received at block 1214 are calculated at block 1220. These transition voltages are calculated for the transition percentages received at block 1214 relative to the top and base voltages calculated at block 1218 for the type of pulse train identified at block 1206.

Returning to decision block 1208, should the operator provide top and base voltage values in addition to transition percentages, then processing continues at block 1210 at which the transition percentages are received. This is similar to the process described above with reference to block 1214. Then, the global top and base voltages are received from the operator at block 1212. This is in lieu of calculating the top and base voltages, as described above with reference to block 1218. Processing then continues at block 1220, as shown in FIG. 12.

Should the operator provide global transition voltages at block 1208, then the processes depicted in connection with 1214 through 1220 need not be performed. Rather, at block 1222 the global transition voltages are received and processing continues at block 1224. In the illustrative embodiment, the global transition voltages are provided by the operator through user interface 116. In alternatives embodiment, transition voltages are provided using other well-known techniques, such as being fixed values, or included in a system configuration file. Processing then continues at block 1220, as shown in FIG. 12.

Regardless of the path taken, once the local or global transition voltages have been determined, then the time of occurrence at which each of the transition voltages is achieved is determined at block 1224 by accessing acquisition data 208. With access to the transition time and voltages as well as acquisition data 208, the signal pulse measurements are computed at block 1226. The results of these measurements are stored in pulse data array 206 at block 1228. Process 1200 then ceases at block 1230.

E. Pulse Analyzer 204

Figure 5:
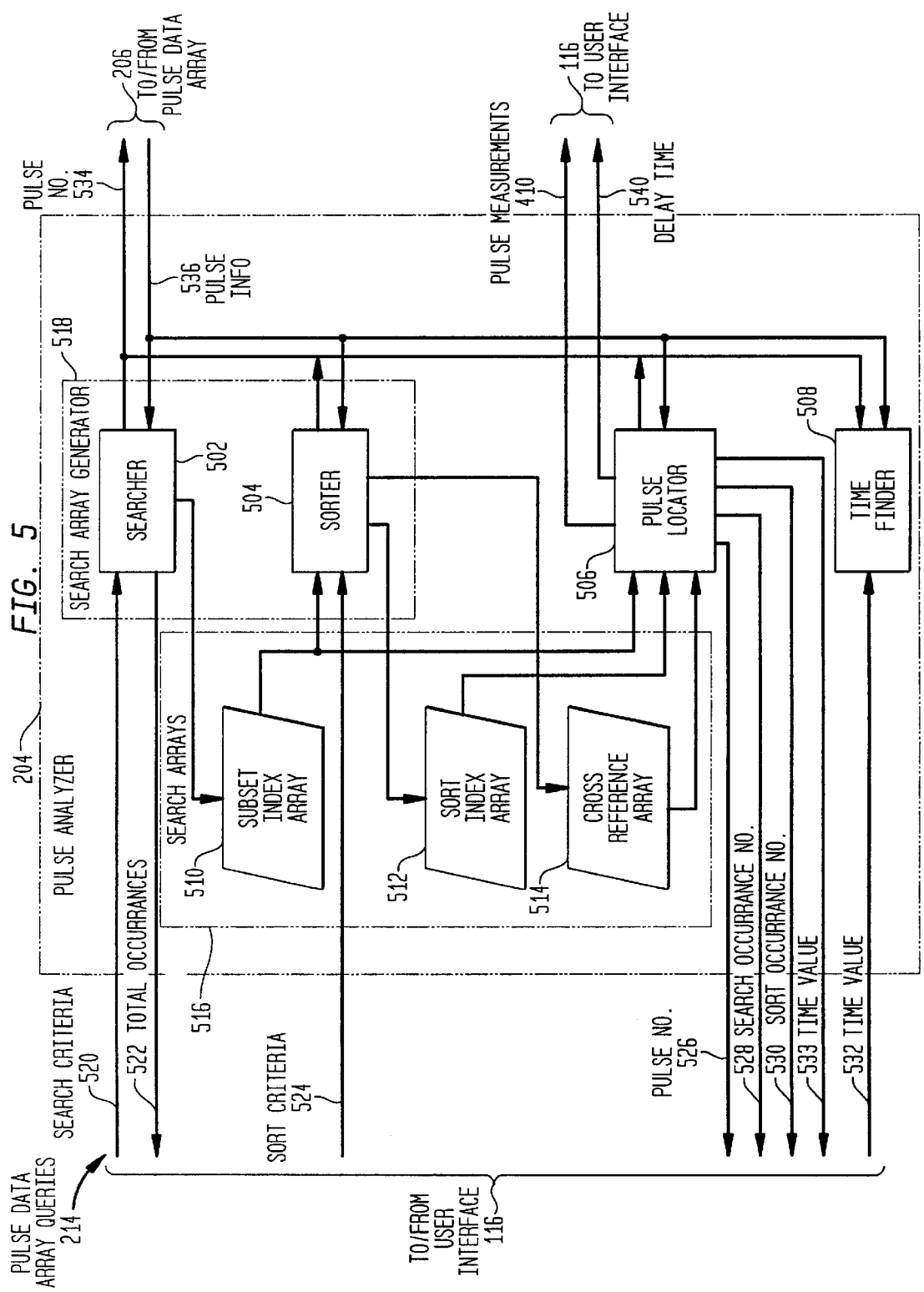
FIG. 5 is a functional block diagram of the pulse analyzer illustrated in FIG. 2 that analyzes the data of the embodiment of the pulse data array illustrated in FIG. 4 in accordance with one embodiment of the present invention.

Pulse analyzer 204 is a device that implements functionality to provide an operator with the ability to search, sort, filter, select, view and otherwise manipulate pulse characteristics 212 stored in pulse data array 206. The operator can manipulate pulse characteristics 212 as necessary to select for display on user interface 116 acquired data 208 of the desired pulse along with its measurement results to gain insights into the behavior of the system or circuit being evaluated. A functional block diagram of one embodiment of pulse analyzer 204 is illustrated in FIG. 5. This embodiment of pulse analyzer 204 will now be described in detail below. In the following description, pulse data array 206 is a data structure that is accessible to and usable by pulse analyzer 204. However, it should become apparent from the following disclosure that pulse analyzer 206 can be configured to operate with any data structure containing pulse characterization data 212.

The primary components of pulse analyzer 204 include a searcher module 502, a sorter module 504, a pulse locator module 506 and a time finder module 508. Searcher 502 and sorter 504 generate a number of data structures, referred to herein as data arrays, to facilitate fast access to pulse data array 206. As such, searcher 502 and sorter 504 together form search array generator 518. Search array generator 518 generates one or more search arrays 516 that are subsequently used by a pulse locator 506 to locate one or more pulses of interest in pulse data array 206. In the illustrative embodiment, three search arrays are generated: a subset index array 510, a sort index array 512 and a cross-reference array 514. Together the three arrays 510, 512 and 514 are referred to generally as search arrays 516.

1. Searcher 502 and Subset Index Array 510

Searcher 502 searches pulse data array 206 to identify those pulses that satisfy search criteria 520. Search criteria 520 is an operator-generated list of one or more characteristics of pulses 404 that the operator is interested in analyzing separately from the other pulses in acquisition data 208. Search criteria 520 is, in this illustrative embodiment, generated by the operator through user interface 116. Searcher 502 generates subset index array 510, which is a time-ordered index array of one or more pulse identifiers 404 that specify those pulses in pulse data array 206 that satisfy search criteria 520. In the illustrative embodiment, the pulse identifier is pulse number 404 which, as noted, is the index into pulse data array 206. However, it should be understood that the pulse identifier may be any suitable identifier or pointer into pulse data array 206.

Because pulse database generator 202 performs all pertinent pulse measurements and stores the results of those measurements, along with other pulse characteristics, into an accessible, well-organized, associative pulse data array 206, searcher 502 can implement virtually any search criteria 520 to select specific ones of those pulses based on the characteristics of the pulses.

In one embodiment, for example, the operator may specify search criteria 520 in the form of a Boolean expression. Such a Boolean expression can include measurement values and other numeric pulse characteristics in terms of relative or absolute values or ranges of values, maximum or minimum values, etc., in combination with other nonnumeric pulse characteristics such as pulse type. One example of a display window or dialog box displayed on display device 112 through graphical user interface 116 is illustrated in FIG. 9A.

Figure 9B:
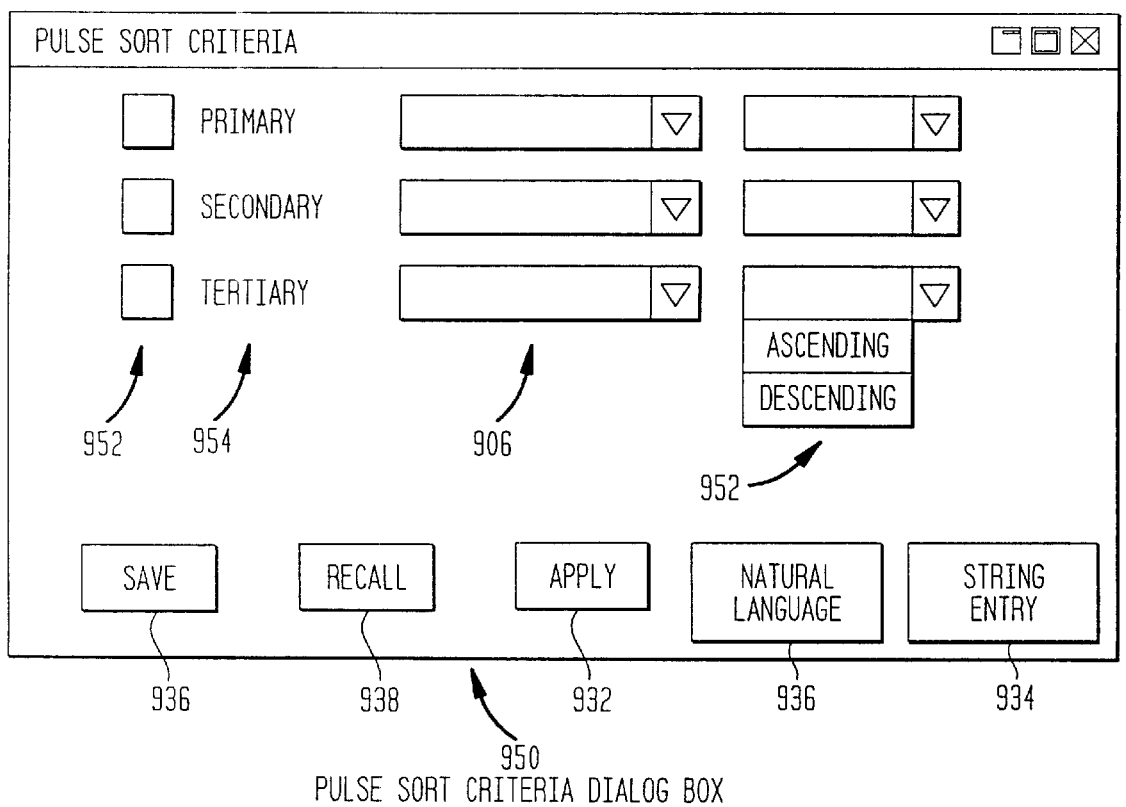
FIG. 9B is an illustration of a dialog box displayed on the user interface to give the operator the capability to specify the sort criteria utilized by the pulse analyzer illustrated in FIG. 2 to sort the acquired signal pulses identified in a search.
Figure 9A:
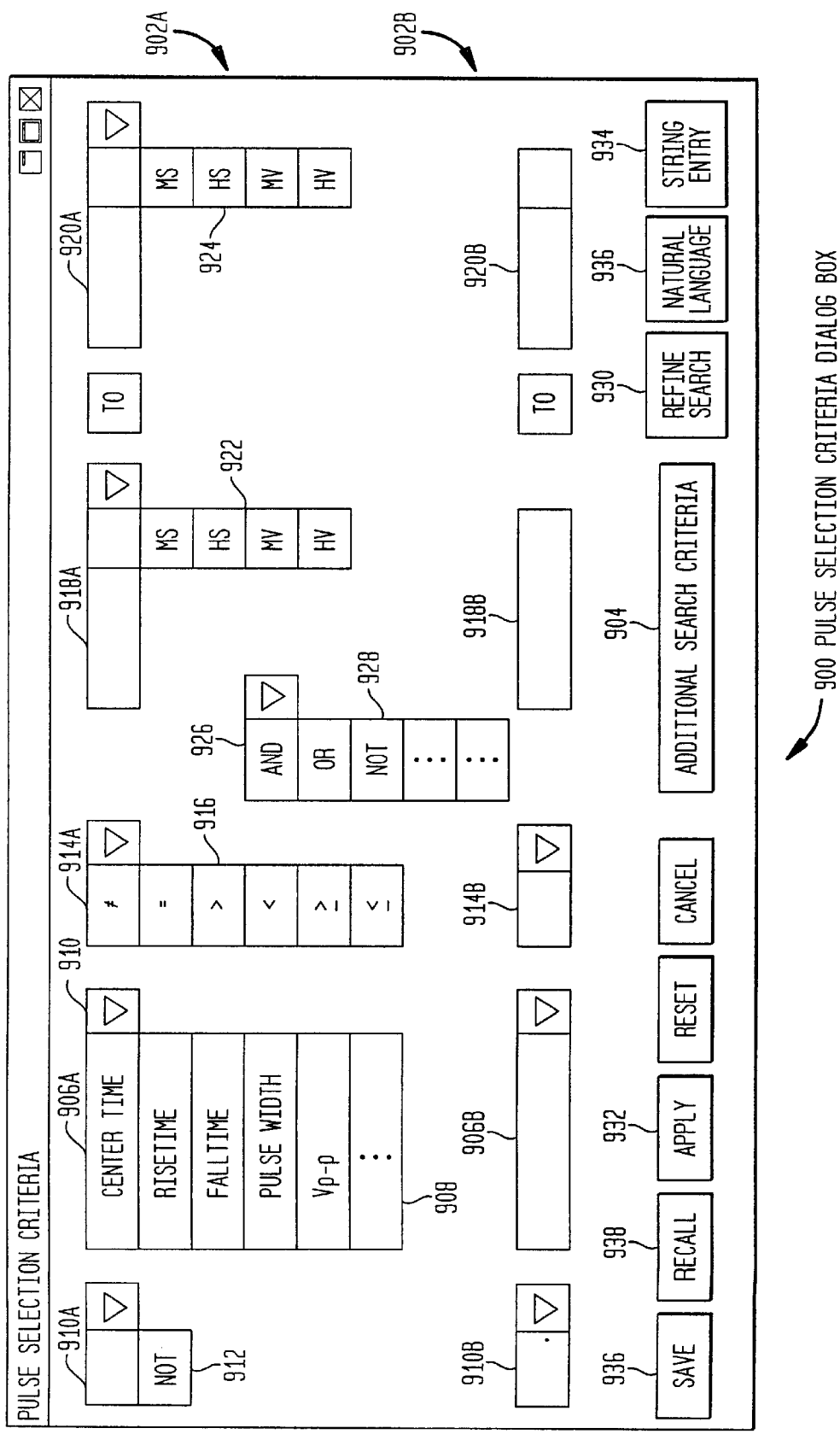
FIG. 9A is an illustration of a dialog box displayed on the user interface to give the operator the capability to specify the search criteria utilized by the pulse analyzer illustrated in FIG. 2 to search the acquired signal pulses in pulse data array.

In FIG. 9A an exemplary "Pulse Selection Criteria" dialog box 900 is illustrated. In this illustrative embodiment, each criterion can be specified by the operator by entering information into the data entry fields or by selecting from a list of menu items, where available. The data entry fields having a finite number of acceptable entries are displayed with pull-down menus providing the available options from which the operator can graphically select the desired item. In the example shown, two criteria can be specified by the operator in dialog box 900.

Referring to search criterion 902A, a characteristic data entry field 906A is provided to receive an entry of the pulse characteristic which is to be the subject of criterion 902A. A pull-down menu 908 provides the operator with the option of entering the pulse characteristic directly, or to select an item from menu 908. Pull-down menu 908 is displayed in response to the operator double clicking the pointing device while the cursor is located within data entry field 906A, or by selecting the menu button 910 adjacent to data field 906. In the limited example shown in FIG. 9A, characteristic data entry field 906A has a pull-down menu 908 that provides center time 408 and a few pulse measurements 410 as the options available to the operator to select from. It should be understood that the available options are preferably consistent with the characteristics stored in pulse data array 206.

To the left of characteristic data entry field 906, there is a negate field 910. The operator can select whether it is the existence or non-existence of the specified characteristic that is desired by leaving field 910 blank or entering "Not" therein. A menu 912 with a single menu item is provided.

The operator can enter the relational operator desired in operator data entry field 914A. Some exemplary operators are shown in a pull-down menu 916. This specifies the relationship the selected pulse characteristic 906A is to have with the values entered into data entry field 918A and, perhaps 920A. The two value data entry fields 918 and 920 are illustrated with the word "to" interposed between the two. Two fields are provided to facilitate the specification of a range of values for a particular characteristic 906. Units pull-down menus 922 and 924 are provided in data entry fields 918, 920 in the illustrative embodiment to facilitate data entry.

A Boolean connector 926 for logically connecting criterion 902A with criterion 902B is provided interposed between criterion 902A and criterion 902B in window 900. A pull-down menu 928 provides a list of available operators.

Depending on the size of dialog box 900 and the space available on graphical user interface 116, additional criteria 902 may be presented in dialog box 900. Alternatively, additional criteria can be specified through a second dialog box (not shown) which is displayed on display 112 in response to the operator selecting the "Additional Search Criteria" button 904. The data entered into such subsequent dialog boxes will be combined with the criteria 902A and 902B as specified by the operator through dialog box 900 and/or the subsequent dialog box. To make such a combination, the subsequent dialog box would require a Boolean connector field similar to field 926 to logically connect the criteria 901A and 902B to the criteria/criterion set out in the second dialog box.

Should a specified search not provide the results desired, the operator can return to dialog box 900 to modify the search criteria specifications. In addition, should the specified search be too broad and capture more pulses than desired, the operator can further refine the search through the selection of the "Refine Search" button 930 located in dialog box 900. Selection of button 930 causes the display of a "next search level" dialog box (not shown) having similar data entry fields as those shown in FIG. 9. In such embodiments, searcher 902 stores the specifications entered into dialog box 900 as a "level 1 search" and those entered into the next dialog box as a "level 2 search". Searcher 502 combines the two levels of search criteria when performring a search of pulse data array 206. However, the search criteria for each level are maintained separately, enabling the operator to refine a search (with a level 2 search criteria), examine the results (of the combined level 1 and level 2 search) and return to the original, broader search (level 1 search) to refine the search again (with a new level 2 search criteria), examine the results (of the combined level 1 and new level 2 search), and so on to effect a desired result. It should be understood that any number of search levels may be managed by searcher 502.

When the operator selects the "Apply" button, graphical user interface 116 converts the data in the data entry fields of dialog box 900 into a syntax string and provides the resulting string to searcher 502 as search criteria 520. Searcher 502 then searches pulse data array 206 using the specified search criteria 520. In an alternative embodiment, upon selection of the "String Entry" button 932 a single data field is displayed in which the operator can enter the search criteria in the form of a string. In such embodiments, searcher 502 preferably includes a syntax checker that verifies the command string entered and, perhaps, provides some form of assistance to educate the operator on the details of the implemented syntax.

Alternatively, searcher 502 can provide additional operators to facilitate the generation of search criteria 520 having a desired level of complexity. For example, searcher 502 may provide the operator with the capability of surrounding one or more criterion 902 with parentheses and brackets to logically group desired criteria 902.

In a further embodiment, searcher 502 provides the operator with the capability of specifying a search criteria 520 using natural language rather than a Boolean description. In response to the operator selecting the "Natural Language" button 936 on dialog box 900, a dialog box (not shown) is displayed with a data entry field for the operator to enter search criteria 520 using natural language phrases. In such embodiments searcher 502 implements a natural language interpreter to interpret the natural language query and convert it to the noted syntax string. Such operations are well known in the art and are specific to the implemented syntax. In alternative embodiments, help functions can be implemented to assist the operator when entering a search criteria. Such help functions often utilize the contents of the entered criteria to infer the operator's intent and display options to the operator to facilitate data entry. Such options may include a list of likely criterion expressions, examples, tips and suggestions, etc.

Although it is preferable to provide the operator with the capability of entering search criteria 520 on graphical user interface 116, it should be understood that search criteria 520 may be provided by other remote or local sources. For example, once the operator has verified the operation of a search query 520, the operator can save it for repeated use by selecting the "Save" button 936 on dialog box 900. A file specification dialog box will appear requesting the name of the file, directory and related information for storing the specified search criteria. In addition, in alternative embodiments, a set of search queries can be generated off-line and transferred into signal measurement system 100 through the use of a computer-readable medium such as a floppy disk or CD ROM, or through a communication port on signal measurement system 100.

In these embodiments, the search queries that were saved previously can be retrieved through the selection of the "Recall" button 938 on dialog box 900. In response to the selection of button 938, a file retrieval dialog box is displayed, providing the operator with a list of saved search query file names for selection by the operator. Upon selection of a stored query, the information contained in that query is converted to the display format shown in FIG. 9A, and the data of that query is presented in the data entry fields illustrated in FIG. 9A.

It should be understood from the forgoing that the scope and sophistication of the search criteria can vary considerably depending on the intended application, and the anticipated experience of the operator, among other factors.

Returning to FIG. 5, upon receipt of a search query 520, searcher 502 accesses pulse data array 206 with a pulse number request 534 and retrieves pulse information 536 associated with the queried pulse number. Searcher 502 successively processes the pulses in pulse data array 206, comparing relevant portions of the returned pulse information 536 with search criteria 520. For those pulses that have associated pulse characteristics 212 that satisfy the current search criteria, searcher 502 places the corresponding pulse number 404 into search index array 510.

Figure 6:
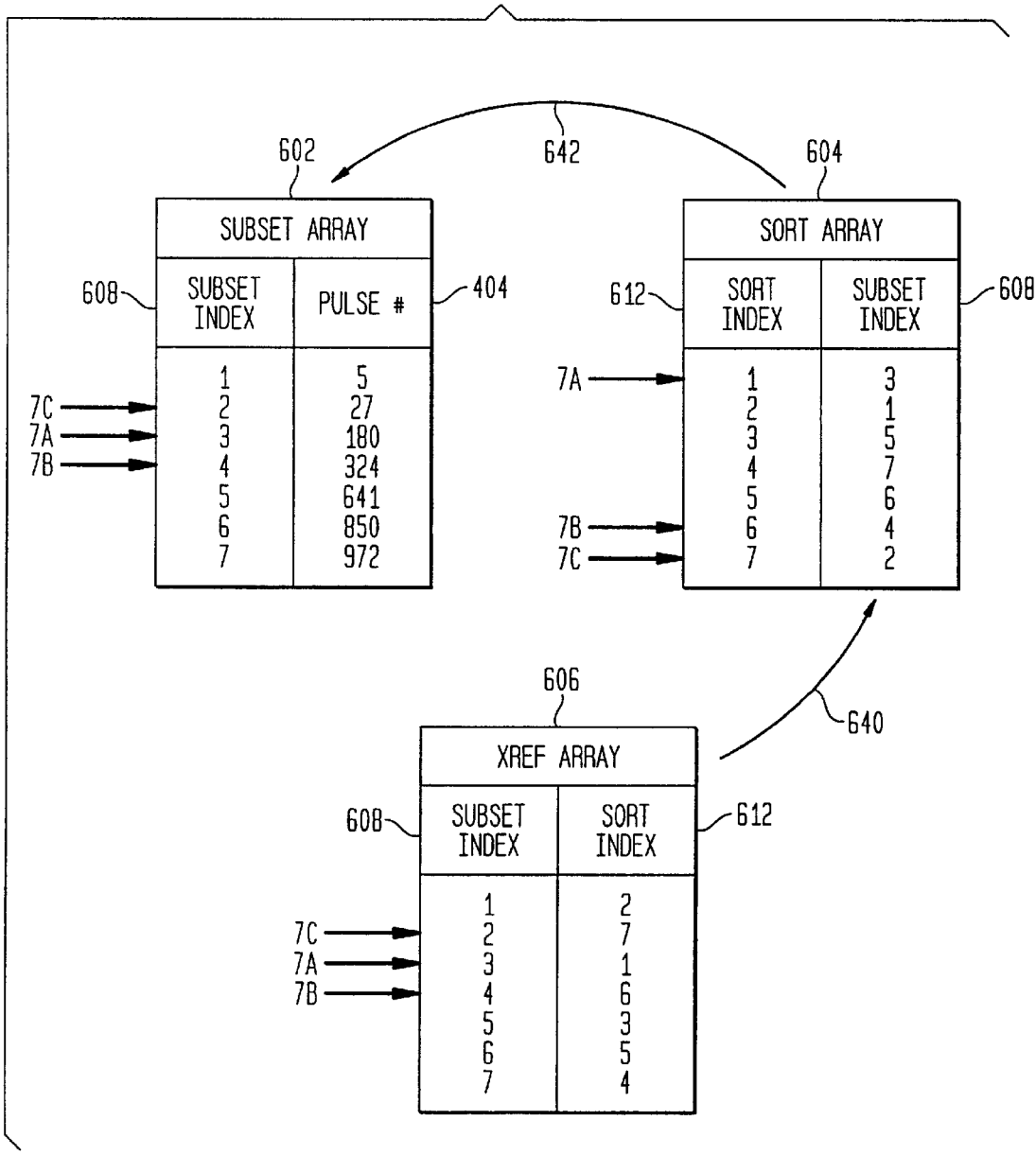
FIG. 6 is a schematic diagram of the search arrays illustrated in FIG. 5 that are generated by the search array generator also illustrated in FIG. 5.

The structure of search index array 510 will be described with reference to an illustrative search of the above-noted exemplary acquisition data 208. Recall that the first measurement yielded a pulse train of 1075 pulses. Pulse database generator 202 processes acquisition data 208 to generate pulse data array 206 containing the measurements 410 for the 1075 pulses along with the center time 408 and type 406 of each pulse. In addition, global measurement statistics 324 are also stored in pulse data array 206. Pulse analyzer 204 searches pulse data array 206 by generating pulse numbers 534 ranging from 1 to 1075, retrieving the associated pulse information stored in pulse data array 206. Searcher 502 then filters each pulse based on search criteria 520, storing pulse number 534 of each pulse that satisfies the search criteria in subset index array 510. FIG. 6 is a diagram of exemplary search arrays, including an exemplary search index array 602.

As shown by the exemplary subset array 602, subset index array 510 is a time-ordered list of pulse numbers 404. Pulse numbers 404 are indexed by a subset index 608 that indicates the relative time of occurrence of the pulses in data array 206 that satisfy the search criteria 520. That is, since pulse data array 206 stores pulse data in order of occurrence, pulse numbers 404 in subset index array 510 are monotonically increasing. Once generated, the search indices cannot be altered.

Of the 1075 pulses in pulse data array 206, the results of the exemplary search yielded 7 pulses; that is, of the 1075 acquired pulses, 7 pulses satisfied the specified search criteria 520. The exemplary subset index array 602 includes a subset index 608 ranging from 1 to 7, sequentially numbered with the associated pulses numbers 404 ordered from the smallest pulse number to the largest; that is, subset array 602 is simply a time-ordered list. Thus, pulse numbers 6, 27, 180, 324, 641, 850 and 972 are stored in subset array 602 with subset indices of 1–7, respectively. Called out in sort index array 602 are three particular pulse numbers 7A–7C which are described below with reference to FIGS. 7A–7C. Also, the relationship between search index array 602 and the other arrays illustrated in FIG. 6 is described below.

Returning again to FIG. 5, a total number of occurrences 522 is generated by searcher 502 indicating the total number of pulses in pulse data array 206 that satisfy search criteria 520. This is displayed on user interface 116 as will be described in detail below.

2. Sorter 504, Sort Index Array 512 Cross-reference Array 514

As noted, pulse analyzer 204 provides the operator with the capability to sort the selected subset of acquired pulses identified in subset index array 510. Sorter 504 sorts this subset of pulses in accordance with sort criteria 524, and generates a sort index array 412. Sort index array 412 is a sorted list of indices into subset index array 410, ordered in accordance with sort criteria 524. In certain embodiments, sorter 504 also generates a cross reference array 414 that includes a list of sort array indices indexed by subset array indices, providing backward mapping from sort index array 412 to subset index array 410. This is described in greater detail below.

Sort criteria 524 is provided by the operator through graphical user interface 116. One example of a display window or dialog box displayed on display device 112 through graphical user interface 116 to enable the operator to specify a sort query is illustrated in FIG. 9B.

In FIG. 9B a "Pulse Sort Criteria" dialog box 950 is illustrated. In this embodiment, each sort criterion 952 can be specified by the operator by entering information in data entry fields, or by selecting information from pull-down menus. The structure and operation of dialog box 950 is not described further herein due to its similarities with Pulse Selection Criteria dialog box 900 illustrated in FIG. 9A and described above. It should be understood that each sort criterion 952 can be a single measurement as shown in FIG. 9B, or can be an arithmetic combination of more than one measurement having common units; for example, rise time and fall time.

It should be noted that the breadth of options available for sort criteria 524 is significant, and stems from sorter 504 having access to pulse data array 206. Thus, sort criteria 524 is independent of search criteria 520, searcher 506 and subset index array 510. In other words, access to pulse data array 206 provides sorter 524 with the capability of considering any and all pulse characteristics stored in pulse data array 206. As a result, sort criteria 524 can include the same or different criteria than search criteria 522.

In operation, sorter 504 accesses subset index array 510 and retrieves sequentially each pulse number 404 stored therein. Sorter 504 then accesses pulse data array 206 with the retrieved pulse number 404. This is illustrated in FIG. 5 as pulse information request 534. Sorter 504 retrieves the relevant pulse characteristics for the queried pulse number 404, as indicated by pulse information 536. Sorter 504 then applies sort criteria 534, assigning a subset index to the subset index 612 associated with the pulse number such that the pulse is in the appropriate relative order in sort index array 512. This process is repeated for all pulses identified in subset index array 510, with the order of the pulses changing as appropriate.

For example, referring to FIG. 6, pulse number 404 associated with subset index 608 of 1 in subset array 602 is retrieved by sorter 504. Sorter 504 then queries pulse data array 206 with pulse number 5. The associated pulse characteristics are applied to sort criteria 524 and the associated subset index 608 is assigned temporarily a sort index of 1. Then, sorter 504 accesses subset index array 602 and retrieves pulse number 404 associated with the second subset index, pulse number 27. Sorter 504 then accesses pulse data array 206 in a similar manner. Sorter 504 then applies sort criteria 524 to both pulse 5 and pulse 27 to determine the relative order of the two pulses. The result is subset index 2 being assigned a sort index of 2. It should be understood that there are many sorting methods that can be used by sorter 504 and that this description is merely illustrative in nature. The same process is repeated for the next pulse number in subset index array 602. When sort criteria 524 is applied to pulses 5, 27 and 180, the resulting sort indices are rearranged such that pulse 180 occurs prior to pulse 5, and pulse 5 occurs prior to pulse 27. This repeated reevaluation continues for all pulses in subset index array 602, resulting in the sorted list of pulses in sort index array 604 having an order of 180, 5, 641, 972, 850, 324, and 27. Sort array 604 includes, therefore, the subset index array indices of 3, 1, 5, 7, 6, 4 and 2 corresponding with the pulse order of 180, 5, 641, 972, 850, 324, and 27, respectively. The subset indices 608 are indexed in sort index array 512 by a sequential sort index 612. Thus, as shown in FIG. 6, sort index array 604 has a sequentially numbered sort index 612 from 1 to 7, with an associated subset index 608 of 3, 1, 5, 7, 6, 4, 2. As noted with respect to subset index array 602 and sort index array 604, there are three entries in sort index array 604 that are called out with reference numbers 7A–7C. These will be described in detail below.

In addition, sorter 504 also generates a cross-references array 514 to facilitate subsequent processing by pulse locator 506 and time finder 508, described below. Cross-reference array 514 provides sort indices indexed by subset index. Thus, the sort index for a corresponding subset index can be obtained through cross-reference array 514. Referring again to the example in FIG. 6, a sort index array 604 and a cross-reference array 606 are shown with data corresponding to the data in subset index array 602 described above. Cross-reference array 606 provides sort indices 612 indexed by subset index 608. Thus, sort index 612 for a corresponding subset index 608 can be obtained through cross-reference array 514. As noted with respect to subset index array 602 and sort index array 604, there are three entries in cross-reference array 606 that are called out with reference numbers 7A–7C. These will be described in detail below.

The relationship between the three arrays 602, 604 and 606 is illustrated in FIG. 6. With subset index 608 the sort index can be obtained through cross-reference array 606 as shown by arrow 640. With a sort index 612, the subset index 608 can be obtained as shown by arrow 642. And, with the subset index 608, the pulse number 404 can be obtained with subset index array 602.

It should be understood that other features and functions of searching and sorting an accessible database could be included in search array generator 518. Each such additional search and sort function may result in the generation of more or less search arrays 516. For example, multiple subset index arrays 510 may be implemented for storing the results of different searches in one alternative embodiment. In another embodiment, other search arrays of pulse numbers are also be generated to store, for example, an indexed list of individually-selected pulse numbers. In addition, the numbers used in FIG. 6 are for illustrative purposes only, with the actual values being consistent with the implemented software language and type of data structure.

3. Pulse Locator 502

Pulse locator 502 utilizes search arrays 516 to efficiently access pulse data array 206 to retrieve pulse characteristics for a particular pulse of interest. Pulse locator 506 causes the display of a selected pulse waveform and associated measurement results for that selected pulse. In addition, a pulse selection window is also presented on graphical user interface 116 to enable the operator to select specific pulses of interest from the searched or sorted lists of pulses, as well as from the pulse data array 206 directly.

Pulse locator 502 accesses pulse data array 206 with a pulse number 534 and retrieves selected pulse characteristics 212, represented by the transfer of pulse information 536 from pulse data array 206 to pulse locator 506. There is a bi-directional transfer of pulse information between user interface 116 and pulse locator 506 to effect the desired transfer of information noted above. Specifically, as shown in FIG. 5, pulse locator 506 receives a pulse number 526, search occurrence number 528 and sorted occurrence number 530 from graphical user interface 116. Through the selection of these values, the operator can select for display the measurement results and waveform display of a desired pulse 1004. In addition, these same values are updated by pulse locator 506 to reflect the relevant information pertaining to the operator-selected pulse 1004. Accordingly, the same values are also shown as also being transferred from pulse locator 506 to user interface 116.

Figure 10A:
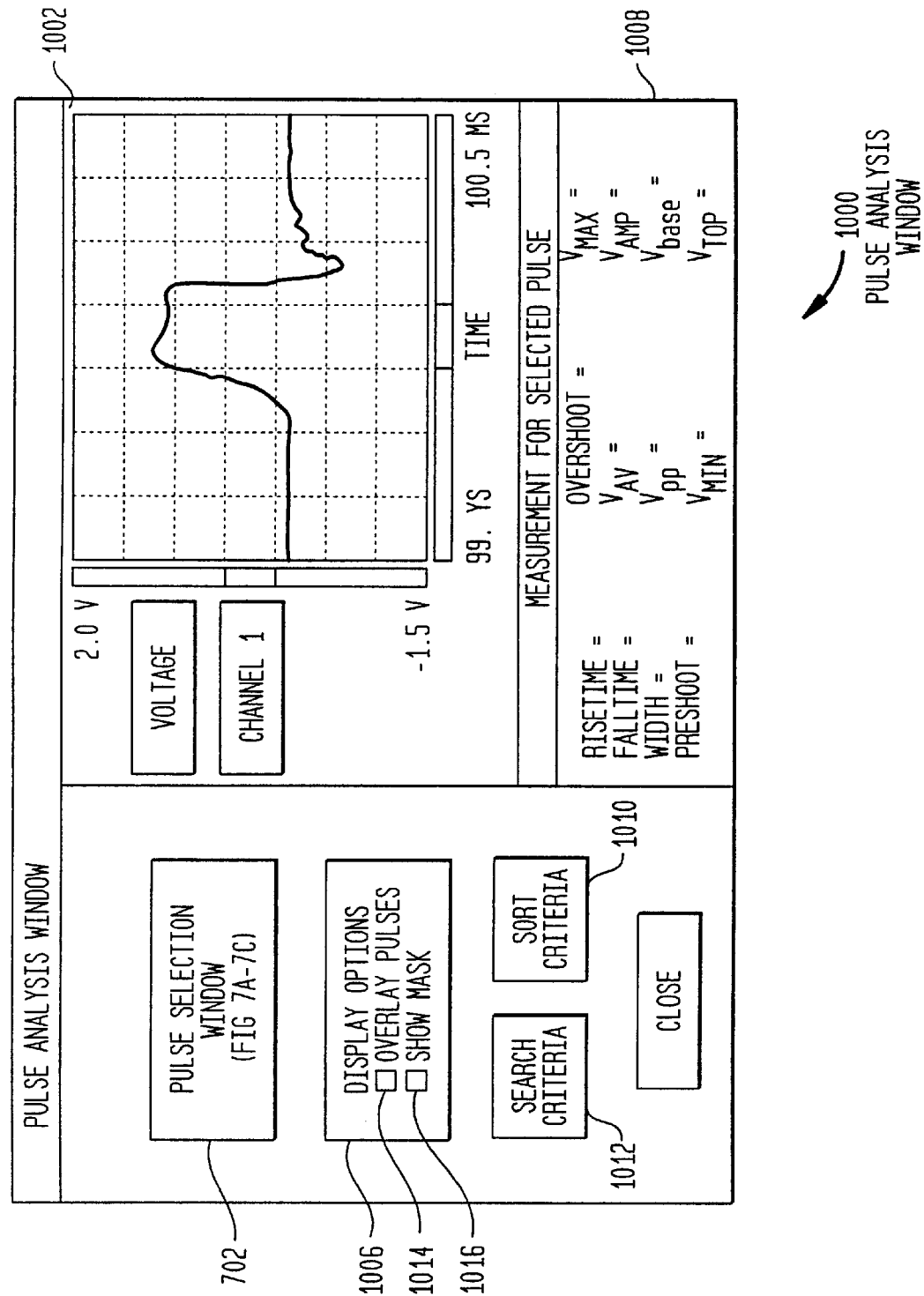
FIG. 10A is an illustration of a dialog box presented on the user interface to display a selected pulse and associated measurement results in accordance with one embodiment of the present invention.

FIG. 10A illustrates one exemplary display window in which the pulse analysis information can be displayed. Window 1000 includes a waveform display region 1002 in which one or more selected pulses 1004 are displayed. Referring to FIG. 5, to display the waveform of the selected pulse 1004, a delay time 540 is transferred to the user interface 116 which in turn transfers the information to waveform analyzer 138 to change the delay of the waveform display such that the selected pulse is displayed in the waveform display region 1002. Pulse locator 506 obtains center time 408 from pulse data array 206 a part of pulse information 536, and provides center time 408 to user interface 116 through the transfer of delay time 540 to user interface 116. In one embodiment, the horizontal scale is not changed; that is, it remains at the scale last set by the operator. In another embodiment, the horizontal scale is changed automatically to a default value. In other embodiments, the operator can change the horizontal scale.

A measurements region 1008 is displayed adjacent to waveform display area 1002. Measurements region 1008 includes pulse measurements 410 for the selected pulse 1004. Pulse locator 506 obtains the measurement results from pulse data array 206 a part of pulse information 536. The measurement results are provided to user interface 116 through the transfer of pulse measurements 410 from pulse locator 506 to user interface 116.

Also displayed in pulse analysis window 1000 is a pulse selection window 702. Pulse selection window 702 will now be described below with reference to FIG. 7 and the exemplary search arrays 602–606 illustrated in FIG. 6. Recall that three particular pulse numbers were identified in each array 602–606 by references 7A–7C. Each of these pulses is displayed in a pulse selection dialog box 702 shown in FIGS. 7A–7C, respectively.

Generally, each pulse selection window 702A–702C includes a pulse number field 704 in which pulse number 404 is displayed. This field has spin buttons and can receive data. As such, the operator can select the pulse number of the pulse that is to be displayed in waveform display region 1002 and for which the corresponding measurement results are to be displayed in measurements region 1004. The changing of the value in this field results in the generation of pulse number 526 from user interface 116 to pulse locator 506. Similarly, when the selected pulse 1004 changes due to other causes (described below), the displayed pulse number changes in field 704 in response to the transfer of pulse number 526 from pulse locator 506 to user interface 116.

In an occurrence number field 706 subset index 608 is displayed. This displayed value indicates the position of the selected pulse (the number 404 of which is concurrently displayed in field 704) relative to the other pulses that satisfied search criteria 520. This field also has spin buttons and can receive data. As such, the operator can select the pulse that is to be displayed in waveform display region 1002 and measurements region 1004 by adjusting the value of the number displayed in occurrence number field 706. The changing of the value in this field results in the transfer of search occurrence number 528 from user interface 116 to pulse locator 506. Similarly, when selected pulse 1004 changes due to other causes, the displayed search occurrence number in field 706 also changes in response to the generation of a search occurrence number 528 by pulse locator 506 to user interface 116. As noted, pulse locator 506 can access pulse data array 206 directly to display relevant information in dialog box 1000. In other words, through the selection of pulse number 404 in pulse number field 704 the operator can select any pulse in pulse data array 406, and the pulse numbers 404 available to the operator are not restricted to displaying those pulses that satisfied search criteria 420. Should the operator select such a pulse number, then pulse locator 406 accesses directly pulse data array 206 without utilizing search array 416. In such circumstances, there is no associated occurrence number 706 or sorted occurrence number 708, and a graphic such as "not available," "N/A," or simply dashed lines " --- " are displayed in those fields.

In a sorted occurrence number field 708 sort index 612 is displayed. The displayed sort index value indicates the position of the selected pulse relative to the other pulses that satisfied search criteria 520 and were sorted in accordance with sort criteria 524. This field has spin buttons and can receive data. As such, the operator can select the pulse that is to be displayed in waveform display region 1002 and measurements region 1004 by adjusting the value displayed in sort occurrence number field 708. The changing of the value in this field results in the transfer of the selected sorted occurrence number 530 from user interface 116 to pulse locator 506. Similarly, when selected pulse 1004 changes due to other causes, the displayed sorted occurrence number changes in field 708 in response to the transfer of a sorted occurrence number 530 from pulse locator 506 to user interface 116. As noted, should the pulse number selected for display not be a pulse that satisfied search criteria 524, then some symbol is displayed in field 706 to indicate this circumstance.

In a pulse center time field 714 center time 408 is displayed. The displayed value of center time 408 indicates the time of occurrence of the pulse relative to the trigger event that cause the acquisition of the signal. This field can receive data and has spin buttons. As such, the operator can select the time of the pulse that is to be displayed in waveform display region 1002 and measurements region 1004. The changing of the value in this field results in the transfer of time value 532 from user interface 116 to time finder 508. As will be described in detail below, time finder 508 identifies the pulse that is closest to the entered time and displays that pulse information in the other fields of pulse selection window 702. Similarly, when selected pulse 1014 changes due to other causes, the displayed center time changes in field 714 in response to the transfer of a time value 533 by pulse locator 506 to user interface 116. Should the pulse number of the pulse closest in time to the entered time not be a pulse that satisfied search criteria 524, then some symbol or text is displayed in fields 706 and 708 to indicate this circumstance.

Figure 7A:
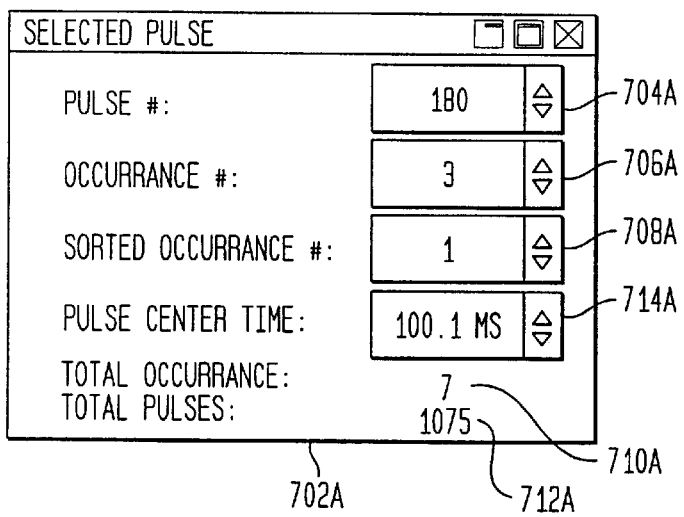
FIG. 7A illustrates an exemplary pulse selection window in which search and sort data for a selected pulse of interest is displayed.

Referring to FIG. 6, in the illustrative example there were 1075 pulses of which 7 pulses satisfied the applied search criteria 520. This information is displayed in total occurrence field 710 and total pulses field 712. These fields are not data entry fields and, therefore, cannot be changed by the operator regardless of which pulse is selected for display, as shown in FIGS. 7A–7C.

The contents of the pulse selection windows 702A–702C will now be described with reference to the exemplary search arrays 516 illustrated in FIG. 6. In FIG. 7A, the pulse characteristics 212 corresponding to the pulse assigned a pulse number of 180 is illustrated. Pulse number 404 is displayed in pulse number field 704A. The displayed occurrence number 706A of pulse number 180 is 3. This is shown in subset index array 602. Arrow 7A references the third element in subset index array 602. The pulse number 404 that is associated with the subset index 3 of subset index array 602 is pulse number 180. The displayed sorted occurrence number 708A is 1. This is illustrated in sort index array 604. There, arrow 7A references the first element of sort index array 604. This element has a sort index, then of 1. Corresponding with a sort index 612 of 1 is a subset index 608 of 3. This is a reference to the third element in subset index array 602 which, as noted is associated with pulse number 180. Thus, of the 7 pulses that satisfied search criteria 520, when sorted, pulse 180 was the first pulse based on the applied sorted criteria 524. The pulse center time 714A displays the center time of pulse 180 retrieved from pulse data array 206. Finally, the total occurrences field 710A and total pulses field 712A show 7 and 1075, respectively, as noted above.

Figure 7B:
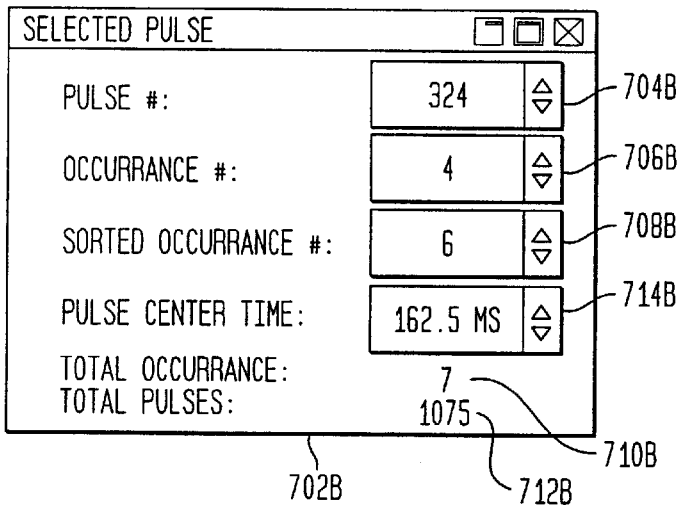
FIG. 7B illustrates another exemplary pulse selection window in which search and sort data for a selected pulse of interest is displayed.
Figure 7C:
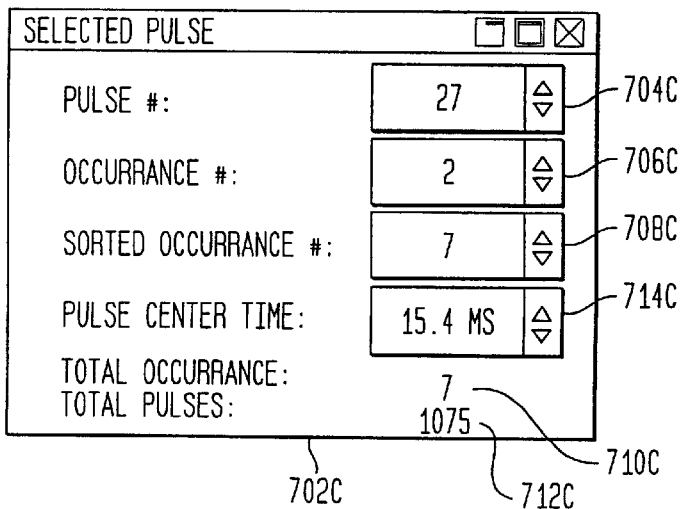
FIG. 7C illustrates a further exemplary pulse selection window in which search and sort data for a selected pulse of interest is displayed.

FIG. 7B is a pulse selection window 702B that displays pulse characteristics and search and sort information of another pulse that satisfied search criteria 520. In this illustration, the subject pulse is the next occurring pulse that satisfied search criteria 520. The contents of pulse selection window 702B can be displayed, for example, by the operator advancing by one the occurrence number 706A in pulse selection window 702A shown in FIG. 7A to display occurrence number 4. This can be achieved by either entering the number into the data field or by selecting the spin buttons to increment or decrement the value. Thus, in FIG. 7B, the occurrence number field 706B has a value of 4.

This change in the displayed value of the occurrence number 706 from the value displayed in window 702A to the value displayed in the window 702B causes the transfer of a search occurrence number 528 having a value of 4 from user interface 116 to pulse locator 506. Upon receipt of this value, pulse locator 506 accesses search arrays 516 to retrieve the sort index 612 and pulse number 404 associated with the requested occurrence number 706 of 4. Specifically, pulse locator 506 accesses subset index array 602 with a subset index 608 of 4. This is identified by reference arrow 7B. Pulse number 404 associated with this subset index is pulse number 324. As shown in FIG. 7B, pulse locator 506 transfers a pulse number 526 of 324 to user interface 116. This, in turn, causes pulse number field 704B to display pulse number 324.

Pulse locator 606 then accesses cross-reference array 606 with subset index 608 of 4 to retrieve the corresponding sort index value 612. As shown by reference line 7B, sort index 612 associated with a subset index 608 of 4 is 6. That is, the sixth element of sort index array 604 corresponds with pulse number 324. This is illustrated in FIG. 6 by reference arrow 7B identifying the sort index array 606 element having a sort index of 6 and a subset index of 4. The sort index value of 6 is transferred from pulse locator 506 to user interface 116 as sorted occurrence number 530. User interface 116 displays this value in sorted occurrence number field 708B, as shown in FIG. 7B.

Pulse locator 506 accesses pulse data array 206 with a value for pulse number 404 of 324 and retrieves corresponding pulse information 536. Pulse locator 506 then provides user interface 116 with a pulse center time value 533 having a value retrieved from pulse data array 206 and transfers center time 408 as delay time 540 to cause waveform display 1002 to display pulse 324 as selected pulse 1004. User interface 116 then displays the center time 408 in pulse center time field 714B. In addition, pulse locator 506 provides user interface 116 with pulse measurements 410 of pulse 324 retrieved from pulse data array 206. As with FIG. 7A, total occurrence field 710B and total pulses field 712B in FIG. 7B show that there are 1075 total pulses of which 7 pulses satisfied the applied search criteria 520.

FIG. 7C is a pulse selection window 702C that displays pulse characteristics and search and sort information of another pulse that satisfied search criteria 520. In this illustration, the subject pulse is the next occurring sorted pulse that satisfied search criteria 520. The contents of pulse selection window 702C can be displayed, for example, by the operator advancing by one the sorted occurrence number 708B in pulse selection window 702B shown in FIG. 7B to display sorted occurrence number 7. This can be achieved by either entering the number into the data field or by selecting the spin buttons to increment or decrement the value. Thus, in FIG. 7C, the occurrence number field 706C has a value of 7.

This change in the displayed value of the sorted occurrence number 706 from the value displayed in window 702B to the value displayed in the window 702C causes the transfer of a sorted occurrence number 530 having a value of 7 from user interface 116 to pulse locator 506. Upon receipt of this value, pulse locator 506 accesses search arrays 516 to retrieve the search index 608 and pulse number 404 associated with the requested sorted occurrence number 708 of 7. Specifically, pulse locator 506 accesses sort index array 604 with a sort index 612 of 7. This is identified by reference arrow 7C. Subset index 608 associated with a sort index of 7 is the subset index of 2. This is shown in FIG. 6 as reference arrow 7C identifying the seventh element in sort index array 604. As shown in FIG. 7C, pulse locator 506 transfers a subset index 608 to user interface 116 as search occurrence number 528. This, in turn, causes pulse number field 706C to display an occurrence number of 7.

Pulse locator 606 then accesses subset index array 602 with subset index 608 of 2 to retrieve the corresponding pulse number value 404. As shown by reference line 7C, pulse number 404 associated with a subset index 608 of 2 is 27. That is, the second element of subset index array 602 corresponds with pulse number 27. This is illustrated in FIG. 6 by reference arrow 7C identifying the subset index array 602 element having a subset index of 2 and a pulse number of 27. The pulse number 404 value of 27 is transferred from pulse locator 506 to user interface 116 as pulse number 526. User interface 116 displays this value in pulse number field 704C, as shown in FIG. 7C.

Pulse locator 506 accesses pulse data array 206 with a value for pulse number 404 of 27 and retrieves corresponding pulse information 536. Pulse locator 506 provides user interface 116 with a pulse center time value 533 having a value retrieved from pulse data array 206 and transfers center time 408 as delay time 540 to cause waveform display 1002 to display pulse 27 as selected pulse 1004. User interface 116 then displays the center time 408 in pulse center time field 714C. In addition, pulse locator 506 provides user interface 116 with pulse measurements 410 of pulse 27 retrieved from pulse data array 206. As with FIGS. 7A and 7B, total occurrence field 710C and total pulses field 712C in FIG. 7C show that there are 1075 total pulses of which 7 pulses satisfied the applied search criteria 520.

Referring again to FIG. 10A, pulse selection windows 702A–702C appear in pulse analysis window 1000 at reference number 702. In addition, pulse analysis window 1000 displays a display options dialog box or field 1006 in which various display options are provided for selection by the operator. In one embodiment the display options include an overlay pulses checkbox 1014. Selection of this checkbox 1014 causes user interface 116 to overlay the selected pulses 1004, for example, by subtracting the center time from each pulse, to facilitate comparison. In another embodiment, the display options 1006 includes a show mask checkbox 1016. Selection of this checkbox 1016 causes the display of a predetermined or selected standardized template commonly used perform "mask testing" of communications signals.

Should the operator determine that additional search and sort operations are necessary once having viewed the selected pulse 1004 in waveform display region 1002, the present invention provides a search criteria button 1012 and a sort criteria button 1010. Selection of either button results in the display of the respective dialog boxes illustrated in FIGS. 9A and 9B and described above.

Figure 10B:
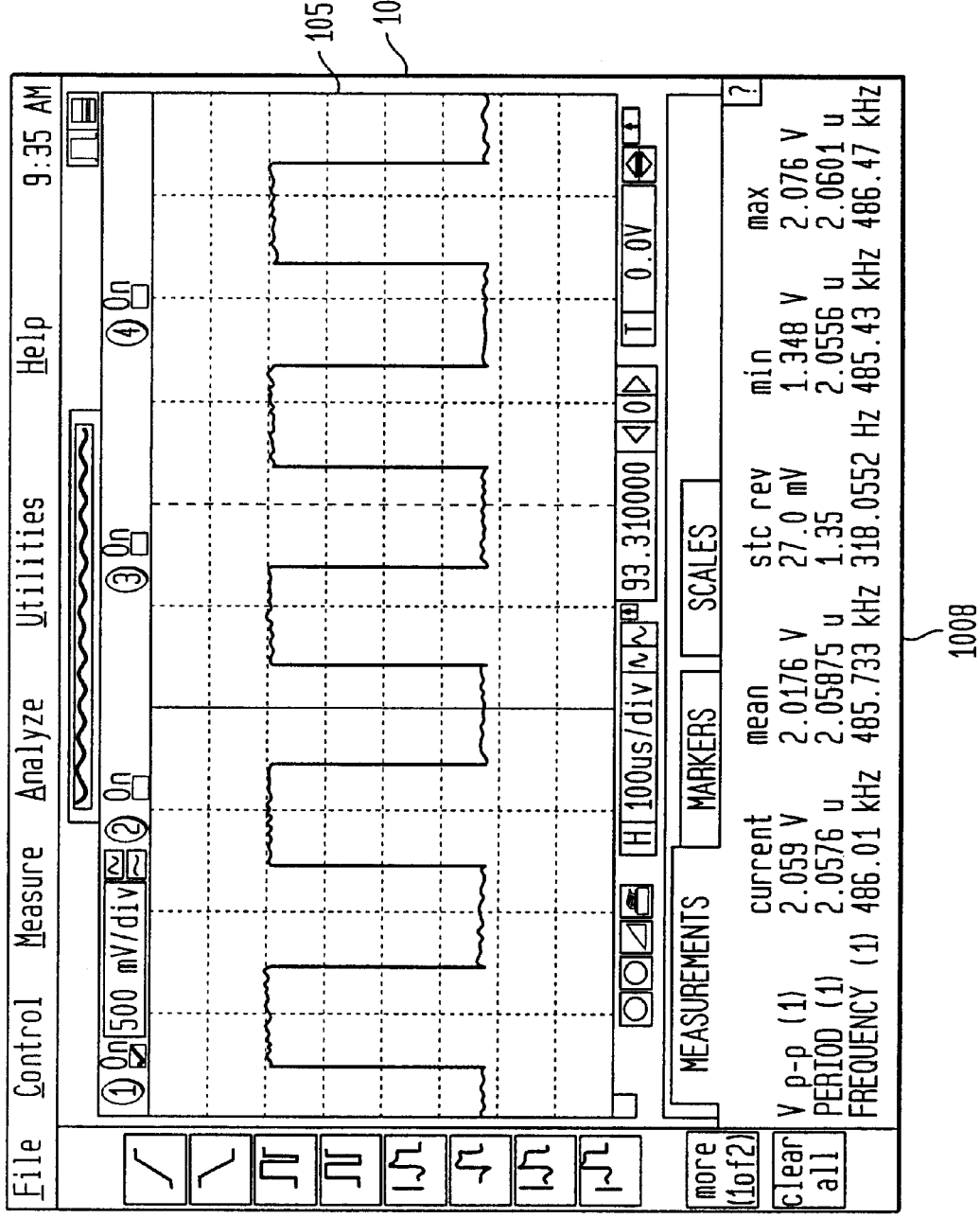
FIG. 10B is an illustration of an alternative embodiment for displaying a selected pulse and associated measurement results of the present invention.

FIG. 10B is an illustration of an alternative waveform display 1050 configured in accordance with one embodiment of the present invention to display a pulse of interest 1004 and associated measurement results 1008 in response to a selection of a desired pulse in a pulse selection window 702. Pulse selection window 702 is not illustrated in FIG. 10B, but can be displayed as an opaque dialog box over waveform display 1050 when invoked by the operator. In this embodiment, pulses adjacent to selected pulse 1004 are illustrated. Displaying a selected pulse in the context of its pulse train may be desirable under certain circumstances. It should be understood that any number of other display arrangements may be provided in the context of the present invention. Those illustrated in FIGS. 10A and 10B are but two examples.

It should be apparent to those of ordinary skill in the art that other arrangements of search arrays 516 can be generated by searcher 502 and sorter 504, and accessed by pulse locator 506 in alternative embodiments of the present invention. For example, in one alternative embodiment, search arrays 516 do not include a cross-reference array 514. In such embodiments, sort index array 512 is searched directly for the sort index associated with a given subset index. Referring to reference arrows 7A and 7B in FIG. 6, for example, when the user advances the subset index 608 from 3 to 4 to display pulse 324, the sorted sequence number 708B of 6 is displayed with the occurrence number 706B of 4. Rather than obtaining the sort index number 612 from cross-reference array 606, pulse locator 506 searches subset array 604 for subset index 608 of 4. When located, the associated sort index 612 of 6 is retrieved from sort index array 604 for display. In other words, the memory and time associated with the generation of cross-reference array 606, and the processing represented by arrow 640 need not be performed. On the other hand, additional processing operations to search sort index array 604 would be implemented to perform the above function. Thus, tradeoffs can be made between the number and complexity of the search array data structures and the processing time that may be required to locate the indices contained therein. Other embodiments implementing different tradeoffs between the costs associated with algorithm processing time and data structure generation and maintenance are considered to be within the scope of the present invention. Other implementations of search arrays 516 are also contemplated. For example, sort index array 512 can be implemented to associate a sort index with pulse number 404 rather than with a subset index. Referring to FIG. 6, for example, the processing associated with arrow 642 is eliminated in such an embodiment. In a further embodiment, subset array 602 is eliminated, and pulse locator 506 would access pulse data array 206 each time an occurrence number or sort occurrence number are adjusted by the operator. In sum, then, the arrangement of search arrays 516 shown in FIGS. 5 and 6 are exemplary only as there are a myriad of alternative approaches each satisfying the needs of a different application.

4. Time Finder 508

In accordance with the illustrative embodiment, the operator may also select a pulse not by its search and sort order or pulse number, but rather by its relative time occurrence. To provide such a capability, pulse analyzer 204 includes a time finder 508. Time finder 508 receives as an input operator-generated time value 532. In one embodiment, this is the horizontal position (delay) that the operator can select through front panel or graphical user input controls. Thus, the operator can drive the delay control 440 directly to set the center of the display at the specified time value 432. In addition, user interface 1I 6 displays a data entry dialog box in which the operator can enter a desired time value 532. In the embodiment illustrated in FIGS. 7A–7C, the operator may enter the time value in pulse selection window 702A–702C.

For example, the operator may not know the pulse number that occurs at a particular time. The operator provides time finder 508 with time value 532. Time finder 508 repeatedly queries pulse data array 206 for center time 408 of certain pulses. Time finder 508 continues searching until it converges on pulse number 404 that has a center time that is closest to time value 532. In one embodiment, a binary search is performed, although other search techniques may be utilized. In an alternative embodiment, a different search technique may be implemented, depending on the attributes and size of pulse data array 206. Once time finder 508 converges on a pulse 404, the pulse is displayed in waveform display region 1002 and the measurements are displayed in measurement display region 1004. The pulse characteristics are displayed in a pulse selection window 702 as described above.

5. Operation

Figure 13A:
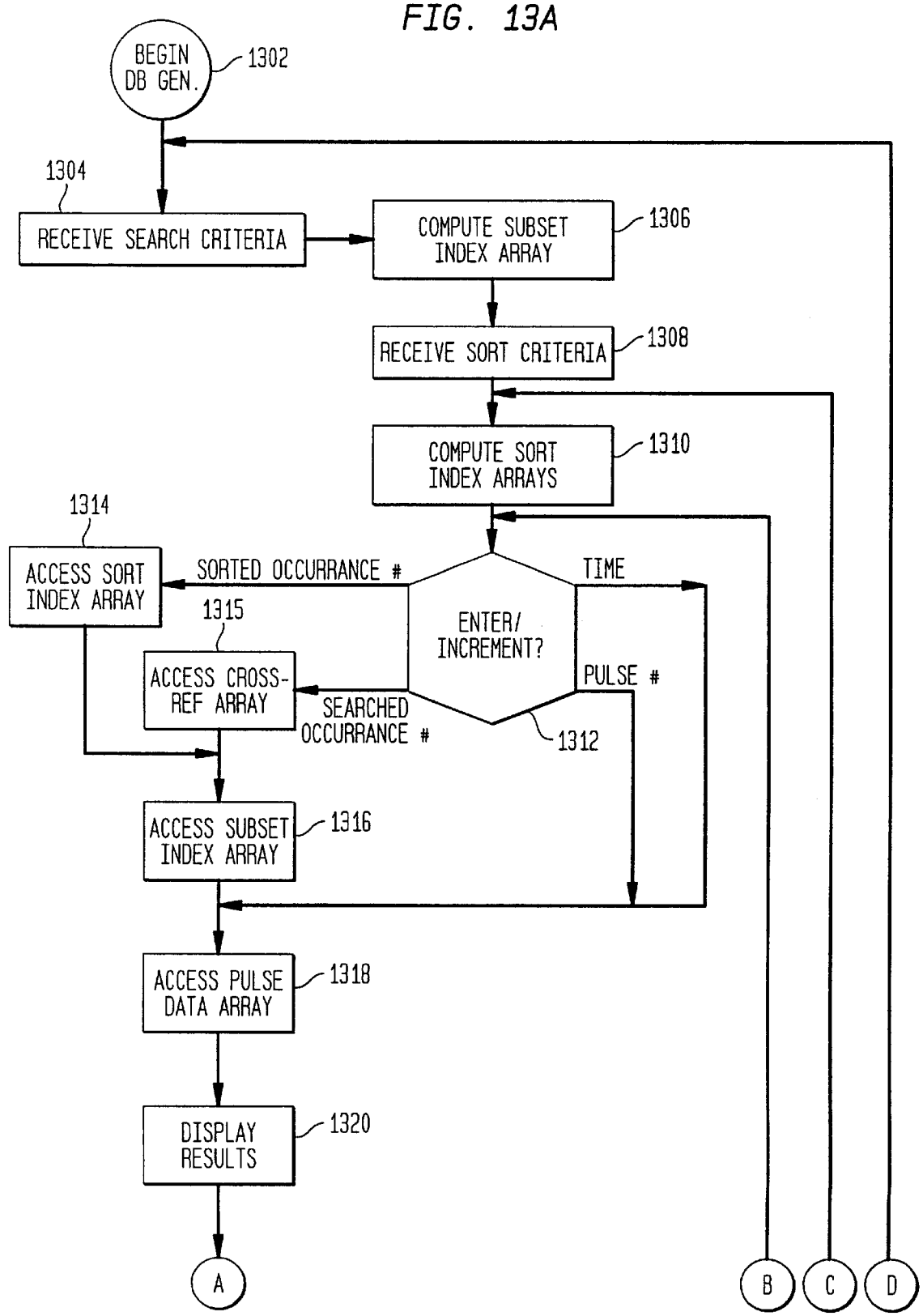
FIGS. 13A and 13B are a flowchart of the processes performed by pulse manager to analyze the pulse data array illustrated in FIG. 4 in accordance with one embodiment of the present invention.
Figure 13B:
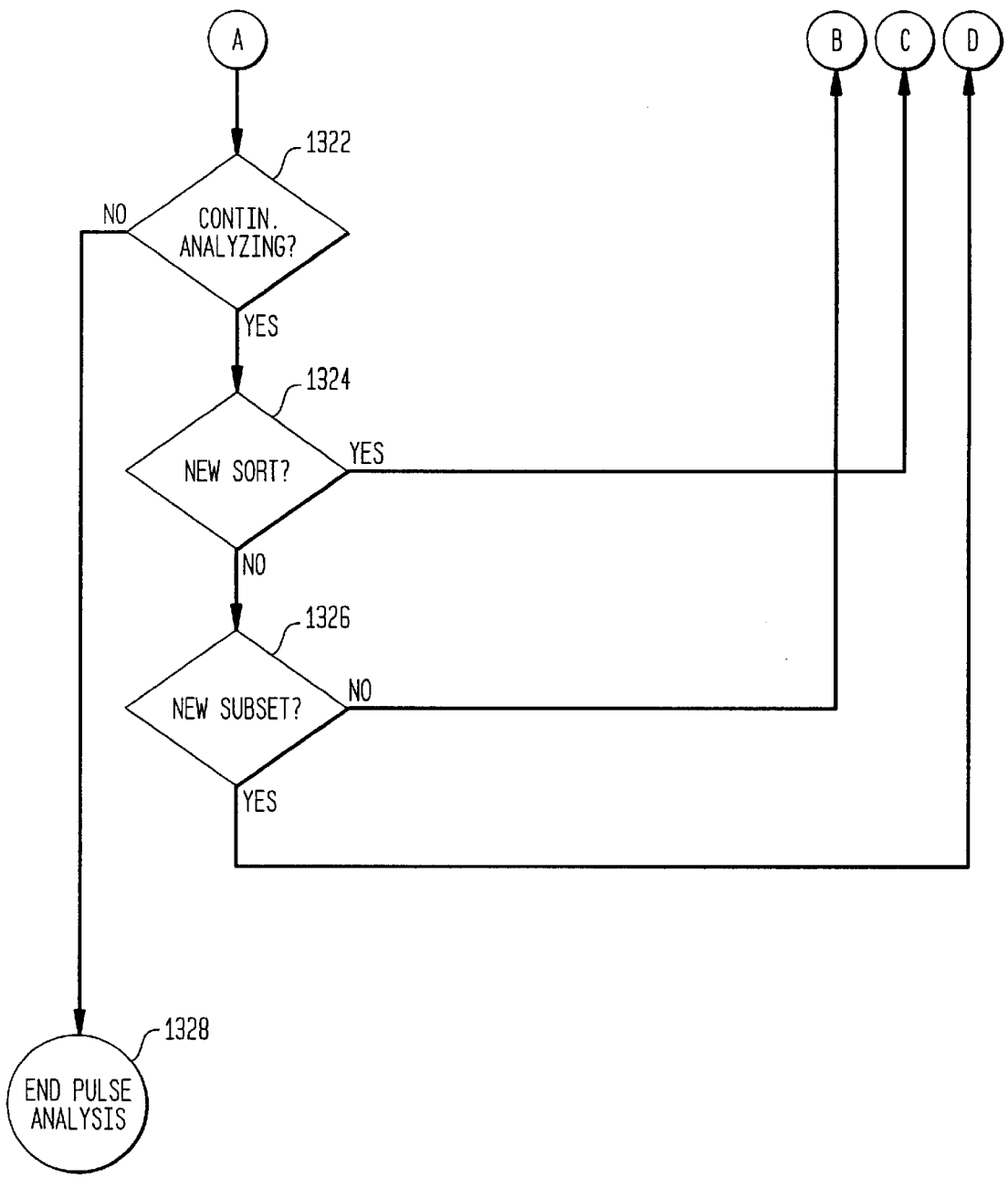

FIG. 13 is a flow chart of the processes performed in accordance with one embodiment of the present invention to analyze one or more pulses in acquired data 208. At begin block 1302, process 1300 is invoked by the operator through graphical user interface 116. For example, the operator may select a menu item in a pull-down menu to invoke process 1300. Alternatively, process 1300 may be invoked automatically and without operator intervention in response to the completion of process 1200.

At block 1304 pulse manager 118 provides the operator with the opportunity to specify the criteria with which pulse data array 208 is to be searched, and receives the search criteria. With search criteria, the subset index array is computed at block 1306. The subset index array is, as noted, an array of values that identify those pulses that satisfy the specified search criteria.

At block 1308 pulse manager 118 provides the operator with the opportunity to provide criteria by which the selected pulses are sorted. The sort criteria is received at block 1308 and the sort index array and cross-reference array are computed at block 1310. Sort index array is a list of search array indices, ordered in accordance with the sort criteria specified at block 1308. Cross-reference array is a list of sort array indices ordered in accordance with the search array indices.

At block 1312 a determination is made as to whether the operator has incremented (advance or decrement) one of the indices, pulse number or time, resulting in a change in the displayed pulse. If the operator changed sorted occurrence number; that is, the sort array index, then the sort index array is accessed at block 1314 to obtain the search array index associated with the specified sort array index. Then, the subset index array is accessed at block 1316 with the new search array index associated with the selected sort index.

As shown in FIG. 13A, processing advances from decision block 1312 to the block 1316 to access the subset index array when the operator enters or changes the searched occurrence number. The cross-reference array is accessed at block 1315 to determine the sorted occurrence number for display to the operator. In either case, at block 1316 the subset index array is accessed with the index entered at block 1312 or retrieved from sort array at block 1314, and the associated pulse identifier is retrieved.

At block 1318, the pulse data array is accessed with the pulse identifier and the associated pulse information is retrieved, enabling the pulse and associated pulse measurements to be displayed at block 1320. In addition, the relative time-ordered and sort-ordered position of the selected pulse may be displayed.

Three decision blocks occur next. At block 1322, a determination is made to continue analyzing. If not, process ends at end block 1328. Otherwise a determination is made at block 1324 whether a new sort criteria has been specified. If so, then processing continues through connector C to block 1308 at which the sort criteria is received. Processing then continues as described above. Otherwise, processing continues at decision block 1326 at which a determination is made as to whether new search criteria has been specified by the operator. If not, then processing continues through connector B at block 1312 to wait for the next operator modification. If new search criteria was specified, then processing continues through connector D to block 1304 at which the new search criteria is received. Processing then continues as described above.

Figure 14:
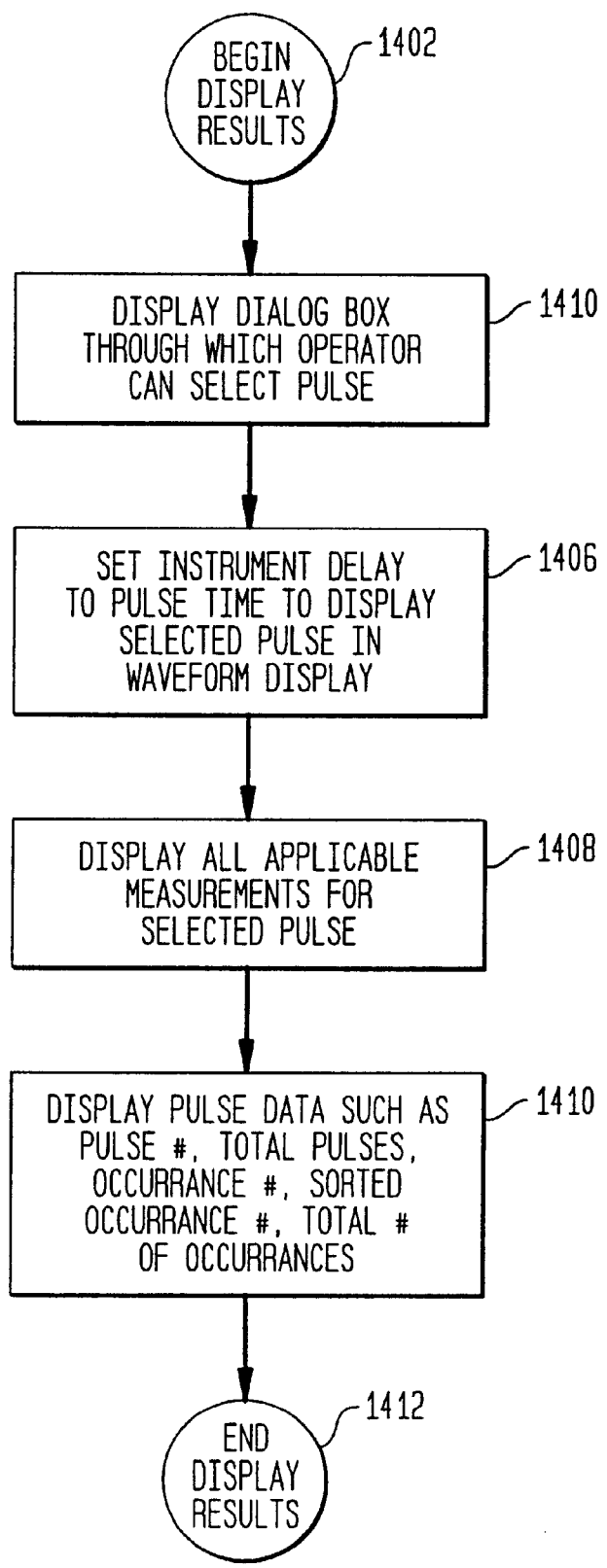
FIG. 14 is a flowchart of the processes performed by the pulse manager to display the results of the analysis performed by the pulse analyzer in accordance with one embodiment of the present invention.

FIG. 14 is a flow chart of the processes performed to display the results of the operations performed in accordance with one embodiment of the present invention. After start block 1402, a dialog box is displayed on the display device to enable the operator to select a pulse of interest at block 1404.

At block 1406, the selected pulse is displayed on the display device. In one particular approach, the instrument delay is set to the center time of the selected pulse so that the selected pulse is displayed in approximately the center of the waveform display.

The results of all measurements performed previously on the selected pulse are displayed at block 1408. As noted, such measurements are performed initially and without operator invocation of specific measurement operations on specific pulses. Rather, all measurements are taken on all pulses of acquired data 208.

Pulse data such as pulse number, total number of pulses, occurrence number, sorted occurrence number and total number of occurrences are displayed at block 1410. Such information is described in detail above. It should be understood that the content and scope of the displayed pulse data may vary depending on the application. For example, if there are additional pulse analysis operations such as searching, sorting, filter, categorizing, tagging, etc., are performed, then information associated with such functions is also displayed.

FIG. 15 is a flow chart of the user interface display and operator interactivity operations performed in accordance with one embodiment of the present invention. At block 1502, the operator interacts with the user interface to request that a search be performed on the acquired pulse data 208. Such a request may come in many forms, such as the graphical selection of a menu item in a pull-down menu or the selection of a dedicated button on a dialog box.

In response to the request made at block 1502, a dialog box is displayed in which the operator enters the criteria that is to guide the search. One such dialog box was described above. Other graphical features may be displayed to enable the operator to provide such search criteria through the user interface. In addition, such a graphical specification may include the identification of a desired one of one or more stored search criteria files. The search criteria is received at block 1506.

At block 1508 one of the selected pulses is displayed along with the measurement results for the selected pulse. This may be the first of many pulses that satisfy the specified search criteria. In FIG. 15, it is noted that this information is provided on the user interface in a pulse data dialog box. Other display features may be used to display such information, depending on the operating system and graphical user interface implemented in the signal measurement system. For example, the waveform of the selected pulse may be displayed in a waveform display region commonly used to display waveforms. This was illustrated in FIG. 10B above.

At decision block 1510, a determination is made whether the operator has requested that the selected pulses be sorted. If not, then processing continues at block 1518 at which the user interface waits to receive an adjustment request to the displayed data. If there is a request for a sort operation, then processing continues at block 1512. Here, a sort criteria dialog box is displayed to enable the operator to specify graphically the sort criteria. As with the search criteria noted above, the dialog box is but one of the many techniques that can be used to enable the operator to graphically make such specifications. The sort criteria entered into the user interface is received at block 1514, and the pulse data dialog box is displayed with the sorted pulses at block 1516.

At block 1518, then device waits for the operator to make a selection on the graphical user interface 116 to change the displayed data. When such occurs, processing advances to block 1518 at which the display pulse dialog box is displayed with the pulse information associated with the new desired pulse.

While various embodiments of the present invention have been described above, it should be understood that they have been presented by way of example only, and not limitation. For example, in some applications, the signal measurement system is not used with its local display but instead is configured to respond to remote commands. Some instruments are configured without displays at all and are operated entirely programmatically. In such applications, the present invention can configure to output the various results such as the acquired data, measurement results and statistics to the remote requester or program rather than to the display or user interface as described above. Such an approach is expressly contemplated, and the implementation of such an approach is considered to be within the purview of those of ordinary skill in the art. As another example, any number or combination of pulse measurements may be implemented in the present invention, examples of which have been mentioned above. These include, overshoot, preshoot, pulse area, peak-to-peak voltage, minimum voltage, maximum voltage, average voltage, volts AC RMS, volts DC RMS, amplitude voltage, base voltage, top voltage, upper voltage, middle voltage, lower voltage, rise time, fall time, pulse width, delta time, plus width, minus width, positive duty cycle, negative duty cycle, period, phase and frequency. The definition and implementation of such pulse measurement functions is considered to be well-known in the art. Thus, the breadth and scope of the present invention are not limited by any of the above-described exemplary embodiments, but are defined only in accordance with the following claims and their equivalents.

What is claimed is:

1. A memory apparatus for storing a data structure accessible by a software program executed on a data processing system, the memory apparatus operationally coupled to a signal measurement system, said data structure comprising:
    a plurality of signal pulse characteristics data units containing information regarding each pulse of an acquired signal stored in an acquisition memory of the signal measurement system; wherein said signal pulse characteristics data units include,
        a pulse identifier data unit uniquely identifying each said pulse of said acquired signal, and
        a plurality of pulse measurement results data units associated with each said pulse identifier.

2. The data structure of claim 1, wherein said signal pulse characteristics further comprise:
    a time of occurrence data unit associated with each pulse identifier data unit in said data structure, said time of occurrence data unit indicating a time said associated pulse occurred relative to a time at which a trigger event causing said storage of said acquired signal occurred.

3. The data structure of claim 2, wherein said data structure further comprises:
    global measurement statistics data units for one or more of said plurality of pulse measurements, wherein said global statistics are associated with said acquired signal in said data structure.

4. The data structure of claim 1, wherein said pulse identifier data unit is a value indicating a relative occurrence of said associated pulse relative to other pulses of said acquired signal.

5. The data structure of claim 3,
    wherein said acquired signal is one of a plurality of acquired signals, the acquisition data for each of which is stored in an acquisition memory,
    wherein said pulse data array includes said pulse characteristics data units and said global measurement statistics data units for a plurality of acquired signals,
    wherein each such pulse characteristics data units and global measurement statistics data units are associated with said unique identifier of said acquisition.

6. The data structure of claim 1, wherein said data structure has a data format suitable for the implementing application.

7. The data structure of claim 2, wherein said pulse characteristics further comprise:
    a pulse type data unit associated with each of said plurality of pulse identifier data units, said pulse type data unit indicting whether said corresponding signal pulse is a positive or negative pulse.

8. The data structure of claim 3, wherein each of said plurality of pulse measurement results data unit associated with each of said plurality of pulse identifier data units in said data structure comprise one or more of the group consisting of:
    rise time measurement results;
    fall time measurement results;
    pulse width measurement results;
    preshoot measurement results;
    pulse area measurement results;
    minimum voltage measurement results;
    maximum voltage measurement results;
    average voltage measurement results;
    volts AC RMS measurement results;
    volts DC RAMS measurement results;
    amplitude voltage measurement results;
    base voltage measurement results;
    top voltage measurement results;
    upper voltage measurement results;
    middle voltage measurement results;
    lower voltage measurement results;
    plus width measurement results;
    minus width measurement results;
    positive duty cycle measurement results;
    negative duty cycle measurement results;
    period measurement results;
    phase measurement results;
    frequency measurement results;
    delta time measurement results;
    peak-to-peak voltage measurement results; and
    overshoot measurement results.

9. The data structure of claim 1, wherein said plurality of pulse identifier data units and said associated pulse characteristic data units are arranged in said data structure in a same sequence as said corresponding signal pulses occur.

10. The data structure of claim 1, wherein said pulse characteristic data units and said pulse identifier data units are stored in said pulse data structure automatically and with no operator involvement.

11. The data structure of claim 1, wherein said data structure is populated automatically and in accordance with measurement parameters.

12. The data structure of claim 11, wherein said measurement parameters are provided at least in part by the operator through a user interface operatively coupled to the signal measurement system.

13. The data structure of claim 1, wherein said data structure is generated and populated by said pulse characteristics in response to an acquisition memory storing said acquired signal.

14. The data structure of claim 1, wherein said signal measurement system is a digital oscilloscope.

* * * * *